(12) United States Patent
Kimura

(10) Patent No.: US 10,128,280 B2
(45) Date of Patent: Nov. 13, 2018

(54) DISPLAY DEVICE AND METHOD FOR DRIVING THE SAME

(71) Applicant: Semiconductor Energy Laboratory Co., Ltd., Atsugi-shi, Kanagawa-ken (JP)

(72) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/814,521

(22) Filed: Nov. 16, 2017

(65) Prior Publication Data

US 2018/0138215 A1 May 17, 2018

Related U.S. Application Data

(63) Continuation of application No. 13/855,753, filed on Apr. 3, 2013, now Pat. No. 9,825,068, which is a (Continued)

(30) Foreign Application Priority Data

Nov. 13, 2001 (JP) .................................. 2001-348032

(51) Int. Cl.
*G09G 3/3233* (2016.01)
*H01L 27/12* (2006.01)
(Continued)

(52) U.S. Cl.
CPC ....... *H01L 27/1255* (2013.01); *G09G 3/3233* (2013.01); *G09G 3/3266* (2013.01);
(Continued)

(58) Field of Classification Search
CPC ........................... G09G 3/2022; G09G 3/3233
See application file for complete search history.

(56) References Cited

U.S. PATENT DOCUMENTS 5,714,968 A 2/1998 Ikeda
5,724,108 A 3/1998 Shibata
(Continued)

FOREIGN PATENT DOCUMENTS

CN 001319892 A 10/2001
CN 001419228 A 5/2003
(Continued)

OTHER PUBLICATIONS

Baldo.M et al., "Highly Efficient Phosphorescent Emission From Organic Electroluminescent Devices", Nature, Sep. 10, 1998, vol. 395, pp. 151-154.
(Continued)

*Primary Examiner* — Kenneth Bukowski
(74) *Attorney, Agent, or Firm* — Fish & Richardson P.C.

(57) ABSTRACT

A semiconductor device having a configuration hardly generating variations in the current value due to a deteriorated EL element is to be provided. A capacitance element is disposed between the gate and the source of a driving TFT, video signals are inputted to the gate electrode, and then it is in the floating state. Suppose an EL element is deteriorated and the anode potential rises, that is, the source potential of the driving TFT rises, the potential of the gate electrode of the driving TFT, being in the floating state by coupling of the capacitance element, is to rise by the same amount. Accordingly, even when the anode potential rises due to the deteriorated EL element, the rise is added to the gate electrode potential as it is, and the gate-source voltage of the driving TFT is allowed to be constant.

11 Claims, 22 Drawing Sheets

Related U.S. Application Data continuation of application No. 13/555,247, filed on Jul. 23, 2012, now Pat. No. 8,508,443, which is a continuation of application No. 10/291,736, filed on Nov. 12, 2002, now Pat. No. 8,242,986.

(51) Int. Cl.
*G09G 3/3266* (2016.01)
*G09G 3/3291* (2016.01)
G09G 3/20 (2006.01)
H01L 27/32 (2006.01)
H04W 52/02 (2009.01)

(52) U.S. Cl.
CPC ......... *G09G 3/3291* (2013.01); *G09G 3/2022* (2013.01); *G09G 2300/0426* (2013.01); *G09G 2300/0842* (2013.01); *G09G 2310/027* (2013.01); *G09G 2310/0251* (2013.01); *G09G 2310/0256* (2013.01); *G09G 2310/061* (2013.01); *G09G 2320/043* (2013.01); *G09G 2330/08* (2013.01); *G09G 2330/10* (2013.01); *H01L 27/3244* (2013.01); *H04W 52/027* (2013.01); *Y02D 70/00* (2018.01)

(56) References Cited

U.S. PATENT DOCUMENTS

| | | |
|---|---|---|
| 5,870,071 A | 2/1999 | Kawahata |
| 5,940,053 A | 8/1999 | Ikeda |
| 5,952,789 A | 9/1999 | Stewart et al. |
| 5,990,629 A | 11/1999 | Yamada et al. |
| 6,011,529 A | 1/2000 | Ikeda |
| 6,057,647 A | 5/2000 | Kurosawa et al. |
| 6,072,450 A | 6/2000 | Yamada et al. |
| 6,157,127 A | 12/2000 | Hosokawa et al. |
| 6,175,345 B1 | 1/2001 | Kuribayashi et al. |
| 6,229,506 B1 | 5/2001 | Dawson et al. |
| 6,246,180 B1 | 6/2001 | Nishigaki |
| 6,351,078 B1 | 2/2002 | Wang et al. |
| 6,356,029 B1 | 3/2002 | Hunter |
| 6,362,798 B1 | 3/2002 | Kimura et al. |
| 6,369,785 B1 | 4/2002 | Imai |
| 6,373,455 B1 | 4/2002 | Kuribayashi et al. |
| 6,380,876 B1 | 4/2002 | Nagao |
| 6,384,804 B1 | 5/2002 | Dodabalapur et al. |
| 6,475,845 B2 | 11/2002 | Kimura |
| 6,496,130 B2 | 12/2002 | Nagao |
| 6,525,704 B1 | 2/2003 | Kondo et al. |
| 6,525,718 B1 | 2/2003 | Murakami et al. |
| 6,548,960 B2 | 4/2003 | Inukai |
| 6,549,184 B1 | 4/2003 | Koyama et al. |
| 6,583,775 B1 | 6/2003 | Sekiya et al. |
| 6,587,086 B1 | 7/2003 | Koyama |
| 6,677,713 B1 | 1/2004 | Sung |
| 6,680,580 B1 | 1/2004 | Sung |
| 6,686,858 B2 | 2/2004 | Nagao |
| 6,690,033 B2 | 2/2004 | Yamazaki et al. |
| 6,697,057 B2 | 2/2004 | Koyama et al. |
| 6,730,966 B2 | 5/2004 | Koyama |
| 6,734,636 B2 | 5/2004 | Sanford et al. |
| 6,756,740 B2 | 6/2004 | Inukai |
| 6,781,153 B2 | 8/2004 | Anzai |
| 6,784,454 B2 | 8/2004 | Anzai |
| 6,791,129 B2 | 9/2004 | Inukai |
| 6,798,405 B2 | 9/2004 | Anzai |
| 6,806,857 B2 | 10/2004 | Sempel et al. |
| 6,828,950 B2 | 12/2004 | Koyama |
| 6,859,193 B1 | 2/2005 | Yumoto |
| 6,876,346 B2 | 4/2005 | Anzai et al. |
| 6,903,731 B2 | 6/2005 | Inukai |
| 6,950,082 B2 | 9/2005 | Sung et al. |
| 6,954,194 B2 | 10/2005 | Matsumoto et al. |
| 6,958,489 B2 | 10/2005 | Kimura |
| 6,982,462 B2 | 1/2006 | Koyama |
| 6,995,520 B2 | 2/2006 | Inukai |
| 7,012,290 B2 | 3/2006 | Kimura |
| 7,053,890 B2 | 5/2006 | Inukai |
| 7,113,154 B1 | 9/2006 | Inukai |
| 7,119,767 B1 | 10/2006 | Komiya et al. |
| 7,122,835 B1 | 10/2006 | Ikeda et al. |
| 7,138,967 B2 | 11/2006 | Kimura |
| 7,173,584 B2 | 2/2007 | Kimura et al. |
| 7,193,591 B2 | 3/2007 | Yumoto |
| 7,196,681 B2 | 3/2007 | Okuda |
| 7,239,083 B2 | 7/2007 | Koyama |
| 7,304,625 B2 | 12/2007 | Koyama et al. |
| 7,315,296 B2 | 1/2008 | Koyama et al. |
| 7,379,039 B2 | 5/2008 | Yumoto |
| 7,388,564 B2 | 6/2008 | Yumoto |
| 7,575,961 B2 | 8/2009 | Ikeda et al. |
| 7,786,958 B1 | 8/2010 | Koyama |
| 7,876,294 B2 | 1/2011 | Sasaki et al. |
| 7,986,094 B2 | 7/2011 | Koyama |
| 8,017,944 B2 | 9/2011 | Yamazaki et al. |
| 8,054,270 B2 | 11/2011 | Koyama et al. |
| 8,059,068 B2 | 11/2011 | Kimura |
| 8,242,986 B2 | 8/2012 | Kimura |
| 8,373,631 B2 | 2/2013 | Koyama et al. |
| 8,390,190 B2 | 3/2013 | Koyama |
| 8,436,790 B2 | 5/2013 | Koyama |
| 8,508,443 B2 | 8/2013 | Kimura |
| 8,519,918 B2 | 8/2013 | Sasaki et al. |
| 8,629,823 B2 | 1/2014 | Koyama et al. |
| 8,829,668 B2 | 9/2014 | Yamazaki et al. |
| 9,262,978 B2 | 2/2016 | Koyama et al. |
| 2001/0035863 A1 | 11/2001 | Kimura |
| 2002/0047120 A1 | 4/2002 | Inukai |
| 2002/0070913 A1 | 6/2002 | Kimura et al. |
| 2003/0090481 A1 | 5/2003 | Kimura |
| 2003/0103022 A1 | 6/2003 | Noguchi et al. |
| 2003/0132931 A1 | 7/2003 | Kimura et al. |
| 2004/0232842 A1 | 11/2004 | Inoue |
| 2005/0253531 A1 | 11/2005 | Matsumoto et al. |
| 2006/0033161 A1 | 2/2006 | Koyama |
| 2006/0197116 A1 | 9/2006 | Kimura |
| 2006/0256047 A1 | 11/2006 | Kimura et al. |
| 2007/0210720 A1 | 9/2007 | Kimura |
| 2008/0316152 A1 | 12/2008 | Kimura et al. |
| 2010/0328294 A1 | 12/2010 | Sasaki et al. |
| 2012/0327059 A1 | 12/2012 | Kimura |
| 2013/0228783 A1 | 9/2013 | Kimura |

FOREIGN PATENT DOCUMENTS

| | | |
|---|---|---|
| EP | 0112700 A | 7/1984 |
| EP | 0883191 A | 12/1998 |
| EP | 0888035 A | 12/1998 |
| EP | 0923067 A | 6/1999 |
| EP | 1003150 A | 5/2000 |
| EP | 1005013 A | 5/2000 |
| EP | 1054512 A | 11/2000 |
| EP | 1061497 A | 12/2000 |
| EP | 1087444 A | 3/2001 |
| EP | 1096465 A | 5/2001 |
| EP | 1103946 A | 5/2001 |
| EP | 1107220 A | 6/2001 |
| EP | 1111574 A | 6/2001 |
| EP | 1128439 A | 8/2001 |
| EP | 1130565 A | 9/2001 |
| EP | 1139454 A | 10/2001 |
| EP | 1148467 A | 10/2001 |
| EP | 1150273 A | 10/2001 |
| EP | 1178462 A | 2/2002 |
| EP | 1253718 A | 10/2002 |
| EP | 1310937 A | 5/2003 |
| EP | 1422736 A | 5/2004 |
| EP | 1555856 A | 7/2005 |
| EP | 1594116 A | 11/2005 |
| EP | 1724927 A | 11/2006 |
| EP | 2276064 A | 1/2011 |
| EP | 2280390 A | 2/2011 |
| EP | 2302614 A | 3/2011 |
| EP | 2309479 A | 4/2011 |

(56) References Cited

FOREIGN PATENT DOCUMENTS

| | | |
|---|---|---|
| JP | 63-250873 A | 10/1988 |
| JP | 04-328791 A | 11/1992 |
| JP | 08-054835 A | 2/1996 |
| JP | 10-069238 A | 3/1998 |
| JP | 10-319908 A | 12/1998 |
| JP | 10-319909 A | 12/1998 |
| JP | 11-003048 A | 1/1999 |
| JP | 11-272233 A | 10/1999 |
| JP | 2000-122607 A | 4/2000 |
| JP | 2000-138572 A | 5/2000 |
| JP | 2000-163015 A | 6/2000 |
| JP | 2000-221942 A | 8/2000 |
| JP | 2000-284749 A | 10/2000 |
| JP | 2000-347621 A | 12/2000 |
| JP | 2000-353811 A | 12/2000 |
| JP | 2001-036408 A | 2/2001 |
| JP | 2001-042822 A | 2/2001 |
| JP | 2001-060076 A | 3/2001 |
| JP | 2001-083924 A | 3/2001 |
| JP | 2001-092413 A | 4/2001 |
| JP | 2001-100696 A | 4/2001 |
| JP | 2001-222257 A | 8/2001 |
| JP | 2001-242827 A | 9/2001 |
| JP | 2002-082651 A | 3/2002 |
| JP | 2002-202756 A | 7/2002 |
| JP | 2003-122303 A | 4/2003 |
| JP | 2003-150105 A | 5/2003 |
| JP | 2003-150106 A | 5/2003 |
| JP | 2003-173154 A | 6/2003 |
| JP | 2003-208127 A | 7/2003 |
| JP | 2003-216110 A | 7/2003 |
| JP | 2003-255897 A | 9/2003 |
| JP | 2003-302579 A | 10/2003 |
| JP | 2003-534574 | 11/2003 |
| JP | 4052865 | 2/2008 |
| JP | 2009-163268 A | 7/2009 |
| JP | 4485119 | 6/2010 |
| JP | 5171721 | 3/2013 |
| JP | 5448275 | 3/2014 |
| JP | 5973025 | 8/2016 |
| KR | 2001-0039666 A | 5/2001 |
| KR | 2001-0051967 A | 6/2001 |
| KR | 2003-0040056 A | 5/2003 |
| TW | 444152 | 7/2001 |
| TW | 459267 | 10/2001 |
| TW | 463393 | 11/2001 |
| TW | 200818100 | 4/2008 |
| TW | 201222515 | 6/2012 |
| WO | WO-1997/034447 | 9/1997 |
| WO | WO-1998/033165 | 7/1998 |
| WO | WO-1998/048403 | 10/1998 |
| WO | WO-2001/006484 | 1/2001 |
| WO | WO-2001/026087 | 4/2001 |
| WO | WO-2001/091095 | 11/2001 |
| WO | WO-2003/019600 | 3/2003 |

OTHER PUBLICATIONS

Baldo.M et al., "Very High-Efficiency Green Organic Light-Emitting Devices Based on Electrophosphorescence", Appl. Phys. Lett. (Applied Physics Letters), Jul. 5, 1999, vol. 75, No. 1, pp. 4-6.
Chen,S et al., "Current Programmed Pixel Structures for OLED", Asia Display / IDW '01, Oct. 1, 2001, pp. 399-402.
Kanicki.J et al., "Amorphous Silicon Thin-Film Transistors Based Active-Matrix Organic Light-Emitting Displays", Asia Display / IDW '01, 2001, pp. 315-318.
Tsutsui.T et al., "Electroluminescence in Organic Thin Films", Photochemical Processes in Organized Molecular Systems, 1991, pp. 437-450.
Tsutsui.T et al., "High Quantum Efficiency in Organic Light-Emitting Devices With Iridium-Complex as a Triplet Emissive Center", Jpn. J. Appl. Phys. (Japanese Journal of Applied Physics), Dec. 15, 1999, vol. 38, No. 12B, pp. L1502-L1504.
Office Action (Application No. 02025532.9) dated May 22, 2006.
Office Action (Application No. 2002-0068075) dated Nov. 27, 2008.
Office Action (Application No. 2007-0111874) dated Nov. 27, 2008.
Office Action (Application No. 200710153394.4) dated Jul. 31, 2009.
European Search Report (Application No. 10178957.6) dated Feb. 16, 2011.
Taiwanese Office Action (Application No. 91132946) dated Mar. 10, 2011.
European Search Report (Application No. 10178953.5) dated May 27, 2011.
European Search Report (Application No. 10178957.6) dated May 27, 2011.
Taiwanese Office Action (Application No. 101102024) dated Jun. 23, 2014.
Taiwanese Office Action (Application No. 104106254) dated Jun. 2, 2016.

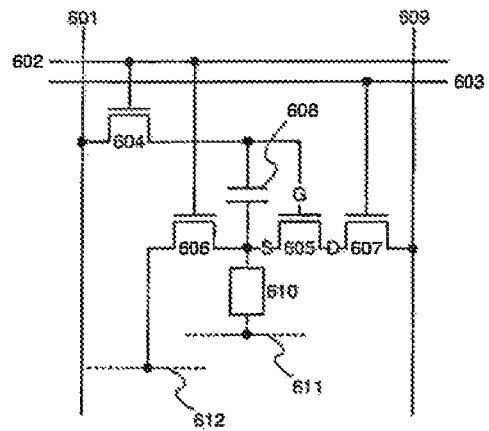
Fig. 6A
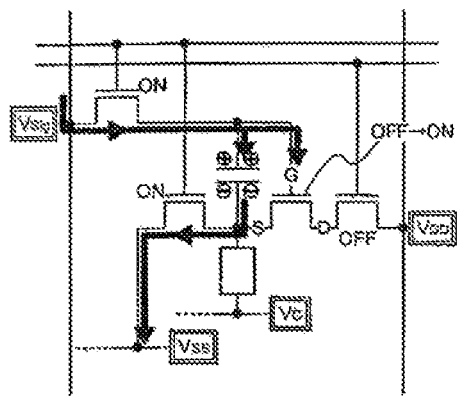 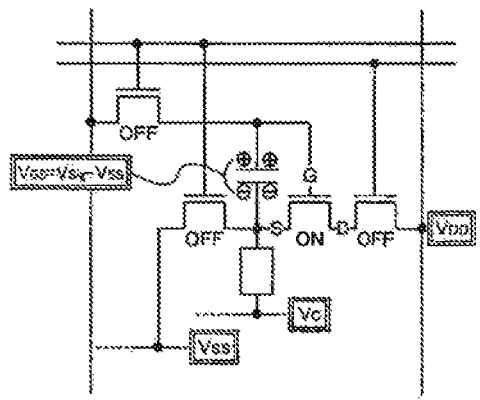
Fig. 6B    Fig. 6C
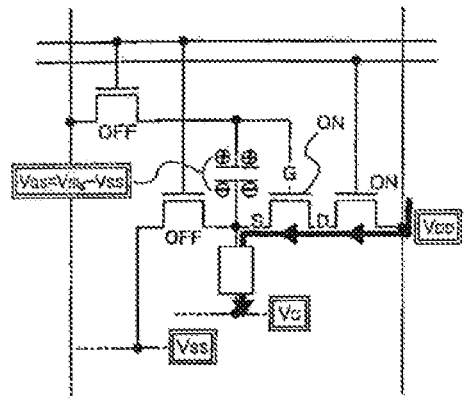 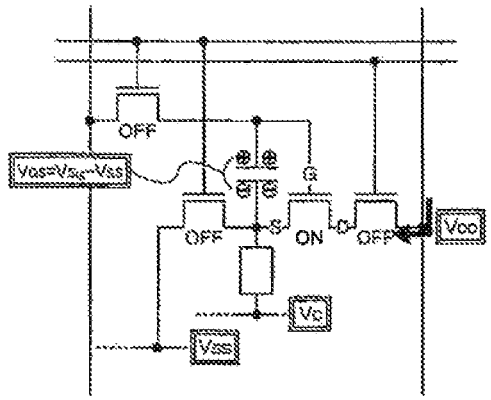
Fig. 6D    Fig. 6E

DISPLAY DEVICE AND METHOD FOR DRIVING THE SAME

CROSS-REFERENCE TO RELATED APPLICATIONS

This application is a continuation of U.S. application Ser. No. 13/855,753, filed Apr. 3, 2013, now allowed, which is a continuation of U.S. application Ser. No. 13/555,247, filed Jul. 23, 2012, now U.S. Pat. No. 8,508,443, which is a continuation of U.S. application Ser. No. 10/291,736, filed Nov. 12, 2002, now U.S. Pat. No. 8,242,986, which claims the benefit of a foreign priority application filed in Japan as Serial No. 2001-348032 on Nov. 13, 2001, all of which are incorporated by reference.

BACKGROUND OF THE INVENTION

The present invention relates to the configuration of a semiconductor device having a transistor. The invention also relates to the configuration of an active matrix display device including a semiconductor device having a thin film transistor (hereafter, it is denoted by TFT) fabricated on an insulator such as glass and plastics. In addition, the invention relates to an electronic device using such the display device.

In recent years, the development of display devices using light emitting elements including electroluminescent (EL) elements has been conducted actively. The light emitting element has high visibility because it emits light for itself. It does not need a back light that is needed in liquid crystal display devices (LCD), and thus it is suitable for forming to have a low profile and has nearly no limits to the field of view.

Here, the EL element is an element having a light emitting layer that can obtain luminescence generated by applying an electric filed. The light emitting layer has light emission (fluorescence) in returning from the singlet excited state to the ground state, and light emission (phosphorescence) in returning from the triplet excited state to the ground state. In the invention, the light emitting device may have any light emission forms above.

The EL element is configured in which the light emitting layer is sandwiched between a pair of electrodes (an anode and a cathode), forming a laminated structure in general. Typically, the laminated structure of the anode/hole transport layer/emissive layer/electron transport layer/cathode is named, which was proposed by Tang et al., Eastman Kodak Company. This structure has significantly high luminous efficiency, which is adapted to many EL elements now under investigation.

Furthermore, there are the other structures laminated between an anode and a cathode in the order of the hole injection layer/hole transport layer/light emitting layer/electron transport layer, or hole injection layer/hole transport layer/light emitting layer/electron transport layer/electron injection layer. As the EL element structure used for the light emitting device in the invention, any structure described above may be adapted. Moreover, fluorescent dyes may be doped into the light emitting layer.

In the specification, the entire layers disposed between the anode and the cathode are collectively called the EL layer in the EL element. Accordingly, the hole injection layer, the hole transport layer, the light emitting layer, the electron transport layer, and the electron injection layer are all included in the EL element. The light emitting element formed of the anode, the EL layer, and the cathode is called EL element.

FIGS. 2A and 2B depict the configuration of a pixel in a general light emitting device. In addition, as the typical light emitting device, an EL display device is exemplified. The pixel shown in FIGS. 2A and 2B has a source signal line 201, a gate signal line 202, a switching TFT 203, a driving TFT 204, a capacitance element 205, a current supply line 206, an EL element 207, and a power source line 208. The P-channel type is used for the driving TFT 204 in FIG. 2A, and the N-channel type is used for the driving TFT 204 in FIG. 2B. The switching TFT 203 is a TFT that functions as a switch in inputting video signals to the pixel, and thus the polarity is not defined.

The connection of each part will be described. Here, the TFT has three terminals, the gate, the source and the drain, but the source and the drain cannot differ from each other distinctly because of the structure of the TFT. Therefore, in describing the connection between the elements, one of the source and the drain is denoted by a first electrode, and the other is a second electrode. When the description is needed for potential of each terminal (the gate-source voltage of a certain TFT) about turning on and off the TFT, the source and the drain are denoted.

Furthermore, in the specification, the TFT being on is the state that the gate-source voltage of the TFT exceeds the threshold and current is carried between the source and the drain. The TFT being off is the state that the gate-source voltage of the TFT drops below the threshold and current is not carried between the source and the drain.

The gate electrode of the switching TFT 203 is connected to the gate signal line 202, the first electrode of the switching TFT 203 is connected to the source signal line 201, and the second electrode of the switching TFT 203 is connected to the gate electrode of the TFT driving TFT 204. The first electrode of the driving TFT 204 is connected to the current supply line 206, and the second electrode of the driving TFT 204 is connected to the anode of the EL element 207. The cathode of the EL element 207 is connected to the power source line 208. The current supply line 206 and the power source line 208 have the potential difference each other. Moreover, to hold the gate-source voltage of the driving TFT 204, a certain fixed potential, the capacitance element 205 may be disposed between the gate electrode of the driving TFT 204 and the current supply line 206, for example.

When a pulse is inputted to the gate signal line 202 to turn on the switching TFT 203, video signals having been outputted to the source signal line 201 are inputted to the gate electrode of the driving TFT 204. The gate-source voltage of the driving TFT 204 is determined in accordance with the potential of the inputted video signals, and the current carried between the source and drain of the driving TFT 204 (hereafter, it is denoted by drain current) is determined. This current is supplied to the EL element 207 to emit light.

SUMMARY OF THE INVENTION

The display device in which TFTs are formed on a substrate and a pixel part and peripheral circuits are built in one piece is applied to mobile devices in significant growth, taking advantage of its small size and lightweight. At the same time, TFTs are formed through many processes such as film deposition, device fabrication by repeating etching, and injection of impurity elements for giving conductivity to semiconductors, thus having a challenge of cost reduction by curtailing the processes.

Then, when the pixel part and the peripheral circuits are configured of unipolar TFTs, a part of the process of injecting impurity elements can be omitted. As an example of a pixel formed by using unipolar TFTs, the pixel shown in FIG. 8 is proposed in *Amorphous Silicon Thin-Film Transistors Based Active-Matrix Organic Light-Emitting Displays ASIA DISPLAY*, page 315, (2001).

The pixel shown in FIG. 8 has a source signal line 801, a gate signal line 802, a switching TFT 803, a driving TFT 804, an active resistance TFT 805, a capacitance element 806, a current supply line 807, EL element 808, and a power source line 809, using the N-channel TFT for the TFTs 803 to 805.

The gate electrode of the switching TFT 803 is connected to the gate signal line 802, the first electrode of the switching TFT 803 is connected to the source signal line 801, and the second electrode of the switching TFT 803 is connected to the gate electrode of the driving TFT 804. The first electrode of the driving TFT 804 is connected to the anode of the EL element 808, and the second electrode of the driving TFT 804 is connected to the first electrode of the active resistance TFT 805. The gate electrode and the second electrode of the active resistance TFT 805 are connected each other, which are connected to the current supply line 807. The cathode of the EL element 808 is connected to the power source line 809, having the potential difference with the current supply line 807 each other. The capacitance element 806 is disposed between the gate electrode of the driving TFT 804 and the current supply line 807, holding the potential of signals applied to the gate electrode of the driving TFT 804.

As shown in FIGS. 2A and 8, the operation of using the N-channel TFT for the driving TFT will be considered. FIG. 2C depicts only the configured portion of the current supply line 206 to the driving TFT 204 to the EL element 207 to the power source line 208 in the pixel shown in FIGS. 2A and 2B. The driving TFT 204 is formed to be the N-channel type, and thus one side connected to the anode of the EL element 207 is the source, and the other side connected to the current supply line is the drain.

Now, suppose the potential of the current supply line 206 is $V_{DD}$, the anode potential of the EL element 207 is $V_A$, the cathode potential thereof is $V_C$, and the potential of the gate electrode of the driving TFT 204 is $V_{Sig}$. The gate-source voltage $V_{GS}$ of the driving TFT 204 is $V_{GS}=(V_{Sig}-V_A)$, and the anode-cathode voltage $V_{EL}$ of the EL element 207 is $V_{EL}=(V_A-V_C)$.

FIG. 2D depicts the voltage-current characteristics of the driving TFT 204 and the EL element 207. The intersection of the voltage-current curve of the driving TFT 204 and the voltage-current curve of the EL element 207 is the operating point, determining the current value carried through the EL element 207 and the anode potential $V_A$ of the EL element. Now, when the voltage-current curve of the EL element 207 is expressed by 211 and the voltage-current curve of the TFT 204 is expressed by 213, the operating point falls into 215, whereby the current value and $V_A=v_{A1}$ are determined. In addition, the gate-source voltage $V_{GS}$ of the driving TFT 204 at this time is expressed by $V_{GS}=(V_{Sig}-V_{A1})$.

Here, the case of the EL element 207 having been deteriorated will be considered. When the EL element 207 is deteriorated, the voltage to start lighting rises, the curve is shifted to the right and expressed by 212. Here, suppose the driving TFT 204 is operated in the saturation region and the deteriorated EL element 207 does not cause the gate-source voltage to be varied, the operating point shifts to 216. More specifically, it turns to be $V_A=V_{A2}$. In this case, even though the source-drain voltage of the driving TFT 204 is varied, the current value is not varied greatly, and thus the luminance is not varied so much. However, at present, the N-channel TFT is used for the driving TFT 204 and the one side connected to the anode of the EL element 207 is the source. Thus, the gate-source voltage $V_{GS}$ of the driving TFT 204 becomes as small as $V_{GS}=(V_{Sig}-V_{A2})$. Therefore, the voltage-current curve of the driving TFT 204 at this time is expressed by 214. Accordingly, the operating point falls into 217. More specifically, the deteriorated EL element 207 caused the source potential of the driving TFT 204 to rise and the gate-source voltage to be small, and thus the current value is changed greatly, leading to the decrease in the luminance.

In the invention, the object is to provide a semiconductor device, in which the N-channel TFT is used for the driving TFT for supplying current to the EL element, capable of solving the problems caused by the deteriorated EL element as described above.

The main point of the above-described object is the deteriorated EL element caused the anode potential of EL element, namely, the source potential of the driving TFT to rise and therefore the gate-source voltage of the driving TFT to be small.

In order to make the current value not to be varied when the EL element is deteriorated, it is necessary to make the gate-source voltage of the driving TFT not to be varied when the deteriorated EL element causes the anode potential of EL element to rise.

In the invention, a structure adopting a bootstrap operation is applied to the pixel. A capacitance element is provided between the gate and the source of the driving TFT, and the source potential is set to a certain value during a period that the image signals are inputted to the gate electrodes. After the image signals are inputted, the gate electrodes are in a floating state. At this time, if the source-gate voltage of the driving TFT is in excess of the threshold value, the driving TFT is turned to ON. However, if the set source potential of the driving TFT is released, the current flows to the EL element, as a result, the anode potential, namely, the source potential of the driving TFT rises. Accordingly, the potential of the gate electrodes in a state of floating, by coupling of the capacitance element disposed between the gate and the source of the driving TFT, is to rise by the same amount. As a result, when the anode potential rises variously due to the deterioration of EL element, the rise can be added over to the potential of the gate electrodes as it is, and the gate-source voltage of the driving TFT is allowed to be constant thereby.

The ability of the capacitance element (storage capacitor) is explained. The gate potential of the driving TFT to which the image signals have been inputted is changed by a leak current of transistors or the like, and the source-gate voltage of the driving TFT is changed. As a result, the drain current of the driving TFT is changed, and the luminance is decreased. That is, the capacitance element needs the ability to hold the charge to set the gate potential of the driving TFT at a constant value or an almost constant value for a predetermined display period.

The configuration of the present invention is described as below.

A semiconductor device of the invention is characterized by comprising a pixel having a light emitting element, wherein the pixel has first and second switching elements having two states, a conducting state and a non-conducting state, a transistor, a capacitance element, and the light emitting element, a video signal is inputted to a first electrode of the first switching element, and a second electrode of the first switching element is electrically connected to a gate electrode of the transistor, a first electrode of the transistor is electrically connected to a first electrode of the second switching element and a first electrode of the light emitting element, and a second electrode of the transistor is electrically connected to a first power source, a second electrode of the second switching element is electrically connected to a second power source, a second electrode of the light emitting element is electrically connected to a third power source, and the capacitance element is disposed between the gate electrode and the first electrode of the transistor.

A semiconductor device of the invention is characterized by comprising a pixel having a light emitting element, wherein the pixel has first, second and third switching elements having two states, a conducting state and a non-conducting state, a transistor, a capacitance element, and the light emitting element, a video signal is inputted to a first electrode of the first switching element, and a second electrode of the first switching element is electrically connected to a gate electrode of the transistor, a first electrode of the transistor is electrically connected to a first electrode of the second switching element and a first electrode of the light emitting element, and a second electrode of the transistor is electrically connected to a first power source, a second electrode of the second switching element is electrically connected to a second power source, a second electrode of the light emitting element is electrically connected to a third power source, the capacitance element is disposed between the gate electrode and the first electrode of the transistor, and a first electrode of the third switching element is electrically connected to the gate electrode of the transistor, and a second electrode of the third switching element is electrically connected to any one of the first electrode of the transistor, the second power source, and the third power source.

A semiconductor device of the invention is characterized by comprising a pixel having a light emitting element, wherein the pixel has first, second and third switching elements having two states, a conducting state and a non-conducting state, a transistor, a capacitance element, and the light emitting element, a video signal is inputted to a first electrode of the first switching element, and a second electrode of the first switching element is electrically connected to a gate electrode of the transistor, a first electrode of the transistor is electrically connected to a first electrode of the second switching element and a first electrode of the light emitting element, and a second electrode of the transistor is electrically connected to a first power source, a second electrode of the second switching element is electrically connected to a second power source, a second electrode of the light emitting element is electrically connected to a third power source, the capacitance element is disposed between the gate electrode and the first electrode of the transistor, and a first electrode of the third switching element is electrically connected to the first electrode of the light emitting element, and a second electrode of the third switching element is electrically connected to the second power source.

A semiconductor device of the invention comprising a pixel having a light emitting element, wherein the pixel has first, second and third switching having two states, a conducting state and a non-conducting state, a transistor, a capacitance element, and the light emitting element, a video signal is inputted to a first electrode of the first switching element, and a second electrode of the first switching element is electrically connected to a gate electrode of the transistor, a first electrode of the transistor is electrically connected to a first electrode of the second switching element and a first electrode of the light emitting element, and a second electrode of the transistor is electrically connected to a first power source through the third switching element, a second electrode of the second switching element is electrically connected to a second power source, a second electrode of the light emitting element is electrically connected to a third power source, and the capacitance element is disposed between the gate electrode and the first electrode of the transistor.

In the semiconductor device of the invention, when a conductivity type of the transistor is an N-channel type, potential $V_1$ of the first power source, potential $V_2$ of the second power source and potential $V_3$ of the third power source can be $V_1 > V_2$ and $V_1 > V_3$.

In the semiconductor device of the invention, the potential $V_2$ of the second power source and the potential $V_3$ of the third power source also can be $V_2 < V_3$.

In the semiconductor device of the invention, when a conductivity type of the transistor is a P-channel type, potential $V_1$ of the first power source, potential $V_2$ of the second power source, and potential $V_3$ of the third power source can be $V_1 < V_2$ and $V_1 < V_3$.

In the semiconductor device of the invention, the potential $V_2$ of the second power source and the potential $V_3$ of the third power source also can be $V_2 > V_3$.

A semiconductor device of the invention is characterized by comprising a pixel having a light emitting element, wherein the pixel has a source signal line, first and second gate signal lines, a current supply line, first, second, and third transistors, a capacitance element, and the light emitting element, a gate electrode of the first transistor is electrically connected to the first gate signal line, a first electrode of the first transistor is electrically connected to a first electrode of the second transistor and a first electrode of the light emitting element, and a second electrode of the first transistor is electrically connected to a first power source having a potential difference with the current supply line each other, or the first or second gate signal line in any one of pixels not including the pixel, a gate electrode of the second transistor is electrically connected to a first electrode of the third transistor, and a second electrode of the second transistor is electrically connected to the current supply line, a gate electrode of the third transistor is electrically connected to the second gate signal line, and a second electrode of the third transistor is electrically connected to the source signal line, a second electrode of the light emitting element is electrically connected to a second power source having a potential difference with the current supply line each other, and the capacitance element is disposed between the gate electrode and the first electrode of the second transistor.

A semiconductor device of the invention is characterized by comprising a pixel having a light emitting element, wherein the pixel has a source signal line, a gate signal line, a current supply line, first, second, and third transistors, a capacitance element, and the light emitting element, a gate electrode of the first transistor is electrically connected to the gate signal line, a first electrode of the first transistor is electrically connected to a first electrode of the second transistor and a first electrode of the light emitting element, and a second electrode of the first transistor is electrically connected to a first power source having a potential difference with the current supply line each other or the gate signal line in any one of pixels not including the pixel, a gate electrode of the second transistor is electrically connected to a first electrode of the third transistor, and a second electrode of the second transistor is electrically connected to the current supply line, a gate electrode of the third transistor is electrically connected to the gate signal line, and a second electrode of the third transistor is electrically connected to the source signal line, a second electrode of the light emitting element is electrically connected to a second power source having a potential difference with the current supply line each other, and the capacitance element is disposed between the gate electrode and the first electrode of the second transistor.

A semiconductor device of the invention is characterized by comprising a pixel having a light emitting element, wherein the pixel has a source signal line, first, second and third gate signal lines, a current supply line, first, second, third and fourth transistors, a capacitance element, and the light emitting element, a gate electrode of the first transistor is electrically connected to the first gate signal line, a first electrode of the first transistor is electrically connected to a first electrode of the second transistor and a first electrode of the light emitting element, and a second electrode of the first transistor is electrically connected to any one of a first power source having a potential difference with the current supply line each other the first, second and third gate signal lines in any one of pixels not including the pixel, and the second and third gate signal lines in the pixel, a gate electrode of the second transistor is electrically connected to a first electrode of the third transistor, and a second electrode of the second transistor is electrically connected to the current supply line, a gate electrode of the third transistor is electrically connected to the second gale signal line, and a second electrode of the third transistor is electrically connected to the source signal line, a second electrode of the light emitting element is electrically connected to a second power source having a potential difference with the current supply line each other, the capacitance element is disposed between the gate electrode and the first electrode of the second transistor, and a gate electrode of the fourth transistor is electrically connected to the third gate signal line, a first electrode of the fourth transistor is electrically connected to the gate electrode of the second transistor, and a second electrode of the fourth transistor is electrically connected to any one of the first electrode of the second transistor, the first power source, and the second power source.

A semiconductor device of the invention is characterized by comprising a pixel having a light emitting element, wherein the pixel has a source signal line, first and second gate signal lines, a current supply line, first, second, third and fourth transistors, a capacitance element, and the light emitting element a gate electrode of the first transistor is electrically connected to the first gate signal line, a first electrode of the first transistor is electrically connected to a first electrode of the second transistor and a first electrode of the light emitting element, and a second electrode of the first transistor is electrically connected to any one of a first power source having a potential difference with the current supply line each other, the first and second gate signal lines in any one of pixels not including the pixel, and the second gate signal line in the pixel, a gate electrode of the second transistor is electrically connected to a first electrode of the third transistor, and a second electrode of the second transistor is electrically connected to the current supply line, a gate electrode of the third transistor is electrically connected to the first gate signal line, and a second electrode of the third transistor is electrically connected to the source signal line, a second electrode of the light emitting element is electrically connected to a second power source having a potential difference with the current supply line each other, the capacitance element is disposed between the gate electrode and the first electrode of the second transistor, and a gate electrode of the fourth transistor is electrically connected to the second gate signal line, a first electrode of the fourth transistor is electrically connected to the gate electrode of the second transistor, and a second electrode of the fourth transistor is electrically connected to any one of the first electrode of the second transistor, the first power source, and the second power source.

A semiconductor device of the invention is characterized by comprising a pixel having a light emitting element, wherein the pixel has a source signal line, first, second and third gate signal lines, a current supply line, first, second, third and fourth transistors, a capacitance element, and the light emitting element, a gate electrode of the first transistor is electrically connected to the first gate signal line, a first electrode of the first transistor is electrically connected to a first electrode of the second transistor and a first electrode of the light emitting element, and a second electrode of the first transistor is electrically connected to any one of a first power source having a potential difference with the current supply line each other, the first, second and third gate signal lines in any one of pixels not including the pixel, and the second and third gate signal lines in the pixel, a gate electrode of the second transistor is electrically connected to a first electrode of the third transistor, and a second electrode of the second transistor is electrically connected to the current supply line, a gate electrode of the third transistor is electrically connected to the second gate signal line, and a second electrode of the third transistor is electrically connected to the source signal line, a second electrode of the light emitting element is electrically connected to a second power source having a potential difference with the current supply line each other, the capacitance element is disposed between the gate electrode and the fit electrode of the second transistor, and a gate electrode of the fourth transistor is electrically connected to the third gate signal line, a first electrode of the fourth transistor is electrically connected to the first electrode of the light emitting element, and a second electrode of the fourth transistor is electrically connected to the first power source.

A semiconductor device is characterized by comprising a pixel having a light emitting element, wherein the pixel has a source signal line, first and second gate signal lines, a current supply line, first, second, third and fourth transistors, a capacitance element, and the light emitting element, a gate electrode of the first transistor is electrically connected to the first gate signal line, a first electrode of the first transistor is electrically connected to a first electrode of the second transistor and a first electrode of the light emitting element, and a second electrode of the first transistor is electrically connected to any one of a first power source having a potential difference with the current supply line each other, the first, second and third gate signal lines in any one of pixels not including the pixel, and the second and third gate signal lines in the pixel, a gate electrode of the second transistor is electrically connected to a first electrode of the third transistor, and a second electrode of the second transistor is electrically connected to the current supply line, a gate electrode of the third transistor is electrically connected to the first gate signal line, and a second electrode of the third transistor is electrically connected to the source signal line, a second electrode of the light emitting element is electrically connected to a second power source having a potential difference with the current supply line each other, the capacitance element is disposed between the gate electrode and the first electrode of the second transistor, and a gate electrode of the fourth transistor is electrically connected to the second gate signal line, a first electrode of the fourth transistor is electrically connected to the first electrode of the light emitting element, and a second electrode of the fourth transistor is electrically connected to the first power source.

A semiconductor device of the invention is characterized by comprising a pixel having a light emitting element, wherein the pixel has a source signal line, first, second and third gate signal lines, a current supply line, first, second, third and fourth transistors, a capacitance element, and the light emitting element, a gate electrode of the first transistor is electrically connected to the first gate signal line, a first electrode of the first transistor is electrically connected to a first electrode of the second transistor and a first electrode of the light emitting element, and a second electrode of the first transistor is electrically connected to any one of a first power source having a potential difference with the current supply line each other, the first, second and third gate signal lines in any one of pixels not including the pixel, and the second and third gate signal lines in the pixel, a gate electrode of the second transistor is electrically connected to a first electrode of the third transistor, and a second electrode of the second transistor is electrically connected to the current supply line, a gate electrode of the third transistor is electrically connected to the second gate signal line, and a second electrode of the third transistor is electrically connected to the source signal line, a second electrode of the light emitting element is electrically connected to a second power source having a potential difference with the current supply line, the capacitance element is disposed between the gate electrode and the first electrode of the second transistor, the capacitance element holds voltage between the gate electrode and the first electrode of the second transistor, and the fourth transistor is disposed between the second electrode of the second transistor and the current supply line, or between the first electrode of the second transistor and the first electrode of the light emitting element, and a gate electrode of the fourth transistor is electrically connected to the third gate signal line.

A semiconductor device of the invention is characterized by comprising a pixel having a light emitting element, wherein the pixel has a source signal line, first and second gate signal lines, a current supply line, first, second, third and fourth transistors, a capacitance element, and the light emitting element, a gate electrode of the first transistor is electrically connected to the first gate signal line, a first electrode of the first transistor is electrically connected to a first electrode of the second transistor and a first electrode of the light emitting element, and a second electrode of the first transistor is electrically connected to any one of a first power source having a potential difference with the current supply line each other, the first and second gate signal lines in any one of pixels not including the pixel, and the second gate signal line in the pixel, a gate electrode of the second transistor is electrically connected to a first electrode of the third transistor, and a second electrode of the second transistor is electrically connected to the current supply line, a gate electrode of the third transistor is electrically connected to the first gate signal line, and a second electrode of the third transistor is electrically connected to the source signal line, a second electrode of the light emitting element is electrically connected to a second power source having a potential difference with the current supply line each other, the capacitance element is disposed between the gate electrode and the first electrode of the second transistor, the capacitance element holds voltage between the gate electrode and the first electrode of the second transistor, and the fourth transistor is disposed between the second electrode of the second transistor and the current supply line, or between the first electrode of the second transistor and the first electrode of the light emitting element, and a gate electrode of the fourth transistor is electrically connected to the third gate signal line.

In a semiconductor device of the invention, the first and third transistors can be the same conductive type.

In a semiconductor device of the invention, the transistors included in the pixel can be the same conductive type.

In a semiconductor device of the invention, when a conductive type of the second transistor is an N-channel type, potential $V_1$ of the current supply line, potential $V_2$ of the first power source, and potential $V_3$ of the second power source are $V_1 > V_2$ and $V_1 > V_3$.

In a semiconductor device of the invention, when the conductive type of the second transistor is the N-channel type, the potential $V_2$ of the first power source, and the potential $V_3$ of the second power source are $V_2 > V_3$.

In a semiconductor device of the invention, when the conductive type of the second transistor is a P-channel type, potential $V_1$ of the current supply line, potential $V_2$ of the first power source, and potential $V_3$ of the second power source are $V_1 < V_2$ and $V_1 < V_3$.

In a semiconductor device of the invention, when the conductive type of the second transistor is the P-channel type, the potential $V_2$ of the first power source, and the potential $V_3$ of the second power source mare $V_2 < V_3$.

A method for driving a semiconductor device of the invention is characterized by that a pixel having a light emitting element is disposed, wherein the pixel has first and second switching elements having two states, a conducting state and a non-conducting state, a transistor, a capacitance element, and the light emitting element, a video signal is inputted to a first electrode of the first switching element, and a second electrode of the first switching element is electrically connected to a gate electrode of the transistor, a first electrode of the transistor is electrically connected to a first electrode of the second switching element and a first electrode of the light emitting element, and a second electrode of the transistor is electrically connected to a first power source, a second electrode of the second switching element is electrically connected to a second power source, a second electrode of the light emitting element is electrically connected to a third power source, the capacitance element is disposed between the gate electrode and the first electrode of the transistor, the method for driving the display device comprising:

a first step of conducting the first and second switching elements to input the video signal to the gate electrode of the transistor, and fixing potential of the first electrode of the transistor, a second step of not conducting the first and second switching elements to allow the gate electrode of the transistor to be in a floating state; and a third step of supplying current corresponding to potential applied to the gate electrode of the transistor to the light emitting element to emit light, wherein in the third step, the capacitance element holds gate-source voltage of the transistor to allow a potential variation of the first electrode of the transistor to be equal to a potential variation of the gate electrode of the transistor.

A method for driving a semiconductor device of the invention is characterized by that a pixel having a light emitting element is disposed, wherein the pixel has first, second and third switching elements having two states, a conducting state and a non-conducting state, a transistor, a capacitance element, and the light emitting element, a video signal is inputted to a first electrode of the first switching element, and a second electrode of the first switching element is electrically connected to a gate electrode of the transistor, a first electrode of the transistor is electrically connected to a first electrode of the second switching element and a first electrode of the light emitting element, and a second electrode of the transistor is electrically connected to a first power source, a second electrode of the second switching element is electrically connected to a second power source, a second electrode of the light emitting element is electrically connected to a third power source, the capacitance element is disposed between the gate electrode and the first electrode of the transistor, and a first electrode of the third switching element is electrically connected to the gate electrode of the transistor, and a second electrode of the third switching element is electrically connected to any one of the first electrode of the transistor, the second power source, and the third power source, the method for driving the display device comprising:

a first step of conducting the first and second switching elements to input the video signal to the gate electrode of the transistor, and fixing potential of the first electrode of the transistor, a second step of not conducting the first and second switching elements to allow the gate electrode of the transistor to be in a floating state;

a third step of supplying current corresponding to potential applied to the gate electrode of the transistor to the light emitting element to emit light; and a fourth step of conducting the third switching element to allow gate-source voltage of the transistor to be equal to or below an absolute value of a threshold voltage, and stopping current supply to the light emitting element, wherein in the third step, the capacitance element holds the gate-source voltage of the transistor to allow a potential variation of the first electrode of the transistor to be equal to a potential variation of the gate electrode of the transistor.

A method for driving a semiconductor device of the invention is characterized by that a pixel having a light emitting element is disposed, wherein the pixel has first, second and third switching elements having two states, a conducting state and a non-conducting state, a transistor, a capacitance element, and the light emitting element, a video signal is inputted to a first electrode of the first switching element, and a second electrode of the first switching element is electrically connected to a gate electrode of the transistor, a first electrode of the transistor is electrically connected to a first electrode of the second switching element and a first electrode of the light emitting element, and a second electrode of the transistor is electrically connected to a first power source, a second electrode of the second switching element is electrically connected to a second power source, a second electrode of the light emitting element is electrically connected to a third power source, the capacitance element is disposed between the gate electrode and the first electrode of the transistor, and a first electrode of the third switching element is electrically connected to the first electrode of the light emitting element, and a second electrode of the third switching element is electrically connected to the second power source, the method for driving the display device comprising:

a first step of conducting the first and second switching elements to input the video signal to the gate electrode of the transistor, and fixing potential of the first electrode of the transistor;

a second step of not conducting the first and second switching elements to allow the gate electrode of the transistor to be in a floating state;

a third step of supplying current corresponding to potential applied to the gate electrode of the transistor to the light emitting element to emit light; and a fourth step of conducting the third switching element to allow gate-source voltage of the transistor to be equal to or below an absolute value of a threshold voltage, and stopping current supply to the light emitting element, wherein in the third step, the capacitance element holds the gate-source voltage of the transistor to allow a potential variation of the first electrode of the transistor to be equal to a potential variation of the gate electrode of the transistor.

A method for driving a semiconductor device of the invention is characterized by that a pixel having a light emitting element is disposed, wherein the pixel has first, second, and third switching elements having two states, a conducting state and a non-conducting state, a transistor, a capacitance element, and the light emitting element, a video signal is inputted to a first electrode of the first switching element, and a second electrode of the first switching element is electrically connected to a gate electrode of the transistor, a first electrode of the transistor is electrically connected to a first electrode of the second switching element and a first electrode of the light emitting element, and a second electrode of the transistor is electrically connected to a first power source through the third switching element, a second electrode of the second switching element is electrically connected to a second power source, a second electrode of the light emitting element is electrically connected to a third power source, and the capacitance element is disposed between the gate electrode and the first electrode of the transistor, the method for driving the display device comprising:

a first step of conducting the first and second switching elements to input the video signal to the gate electrode of the transistor, and fixing potential of the first electrode of the transistor;

a second step of not conducting the first and second switching elements to allow the gate electrode of the transistor to be in a floating state;

a third step of conducting the third switching element to supply current corresponding to potential applied to the gate electrode of the transistor to the light emitting element to emit light; and a fourth step of not conducting the third switching element and stopping current supply to the light emitting element, wherein in the third step, the capacitance element holds gate-source voltage of the transistor to allow a potential variation of the first electrode of the transistor to be equal to a potential variation of the gate electrode of the transistor.

BRIEF DESCRIPTION OF E DRAWINGS

FIGS. 6A to 6E are diagrams for illustrating an embodiment of the invention and the operation;

FIGS. 1A to 11C are diagrams for illustrating the time gray scale system;

DESCRIPTION OF THE PREFERRED EMBODIMENT

Embodiment 1

Figure 1A:
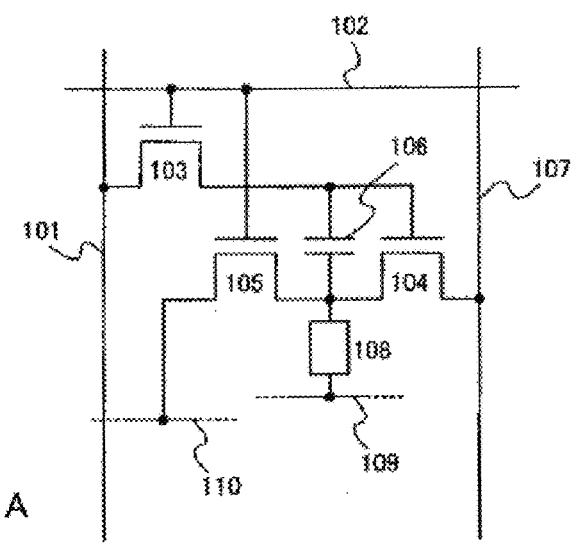
FIGS. 1A and 1B are diagrams for illustrating an embodiment of the invention and the operation.

FIG. 1A depicts an embodiment of the invention. The pixel of the invention has a source signal line 101, a gate signal line 102, first, second and third TFTs 103 to 105, a capacitance element 106, a current supply line 107, an EL element 108, and power source lines 109 and 110. The gate electrode of the TFT 103 is connected to the gate signal line 102, the first electrode of the TFT 103 is connected to the source signal line 101, and the second electrode of the TFT 103 is connected to the gate electrode of the TFT 104. The first electrode of the TFT 104 is connected to the current supply line 107, and the second electrode of the TFT 104 is connected to the first electrode of the TFT 105 and the first electrode of the EL element. The gate electrode of the TFT 105 is connected to the gate signal line 102, and the second electrode of the TFT 105 is connected to the power source line 110. The second electrode of the EL element 108 is connected to the power source line 109. The capacitance element 106 is disposed between the gate electrode and the second electrode of the TFT 104, holding the gate-source voltage.

Now, all the TFTs 103 to 105 are the N-channel TFT, and they are to be turned on when the gate-source voltage exceeds the threshold. In addition, in the EL element 108, the first electrode is the anode, and the second electrode is cathode. The anode potential is set $V_A$, and the cathode potential, i.e. the potential of the power source line 109 is set $V_C$. Furthermore, the potential of the current supply line 107 is set $V_{DD}$, and the potential of the power source line 110 is set $V_{SS}$. The potential of the video signal is set $V_{Sig}$.

Figure 3A:
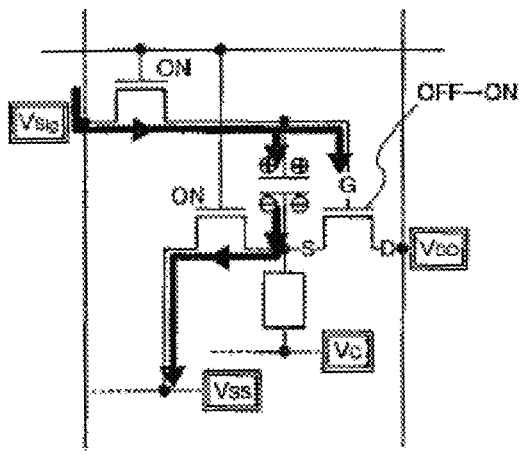
FIGS. 3A to 3C are diagrams for illustrating the operation of the circuit as according to the configuration shown in FIG. 1A.

The operation of the circuit will be described with FIGS. 1A, 1B and 3A to 3C. Here, the gate (G), the source (S), and the drain (D) of the TFT 104 is defined as shown in FIG. 3A.

Figure 3B:
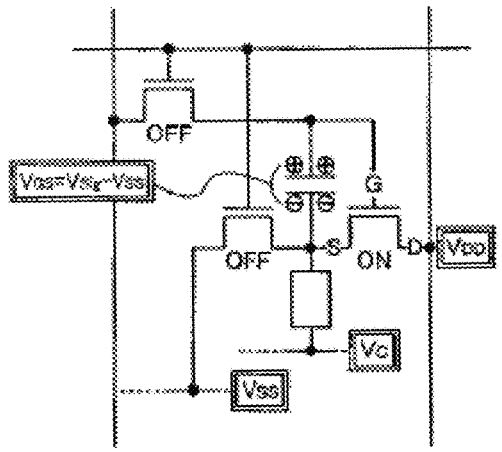
Figure 3C:
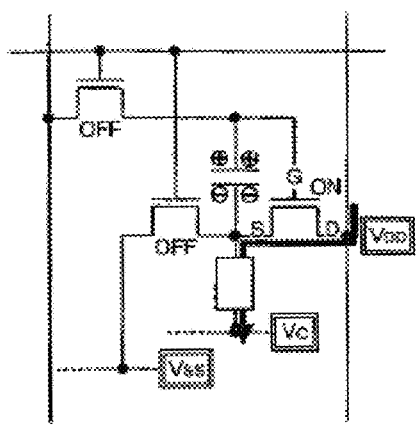

The gate signal line 102 is selected in a certain pixel to turn on the TFTs 103 and 105. As shown in FIG. 3A, video signals are inputted to the gate electrode of the TFT 104 from the source signal line 101, and the potential is turned to be $V_{Sig}$. In the meantime, the TFT 105 is on, thus being $V_A=V_{SS}$. At this time, when $V_{SS} \leq V_C$ is set, current is not carried through the EL element 108 in writing the video signals. However, $V_{SS} > V_C$ is set, and thus it is acceptable to carry current through the EL element 108. The essence here is that $V_A$ is fixed to a fixed potential. According to this operation, the voltage between both electrodes of the capacitance element 106 is turned to be $(V_{Sig}-V_{SS})$. Then, when the select period of the gate signal line 102 is finished and the TFTs 103 and 105 are turned off, the migration path of charges stored in the capacitance element 106 is gone, and the gate-source voltage $(V_{Sig}-V_{SS})$ of the TFT 104 is held (FIG. 3B).

Here, when $(V_{Sig}-V_{SS})$ exceeds the threshold of the TFT 104, the TFT 104 is turned on, current is started to carry through the EL element from the current supply line 107, and light emission is started (FIG. 3C), increasing the source potential of the TFT 104. At this period, the gate electrode of the TFT 104 is in the floating state, and the capacitance element 106 holds the gate-source voltage of the TFT 104. Thus, the potential of the gate electrode is increased with the rise in the source potential. At this period, the capacitance component exists between the gate electrode and the semiconductor layer (in the source region or drain region) in the TFTs 104 and 105, but the capacitance value of the capacitance element 106 is set to be dominant sufficiently over the capacitance component, whereby the rise in the source potential of the TFT 104 is made nearly equal to the rise in the gate potential of the TFT 104.

Figure 1B:
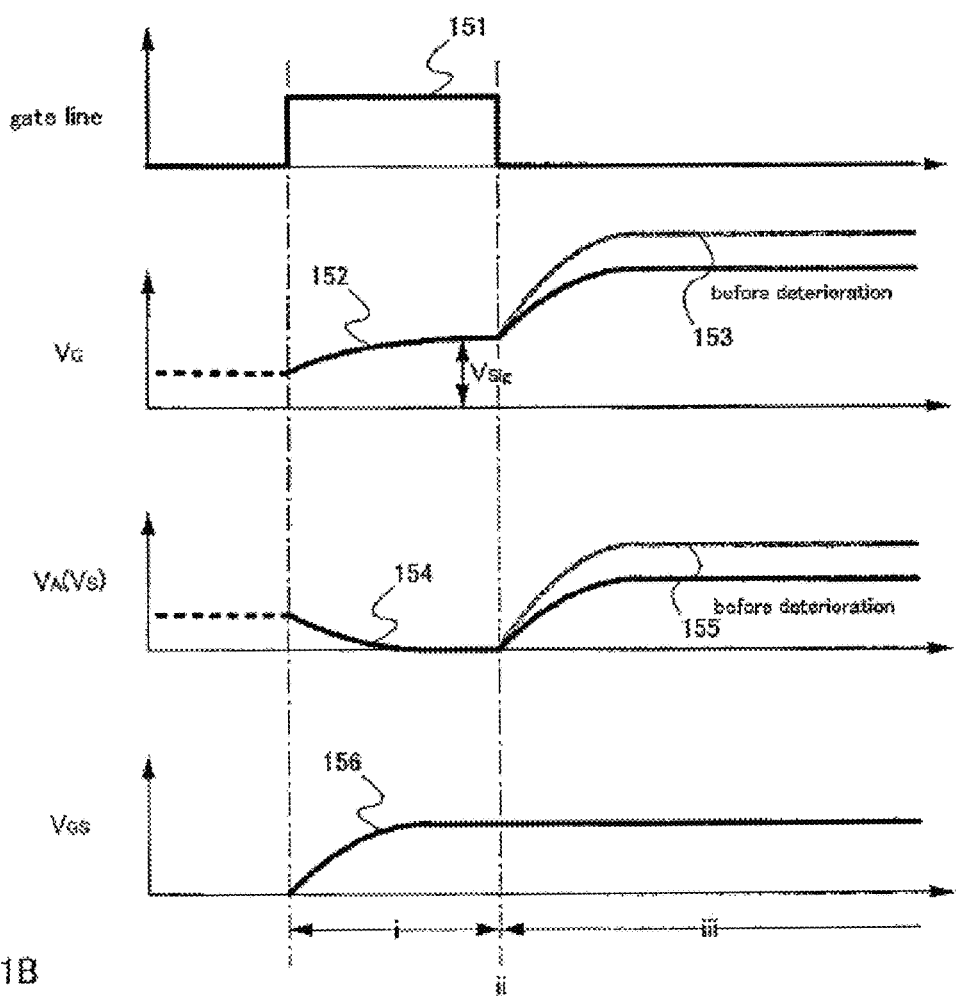
Figure 2A:
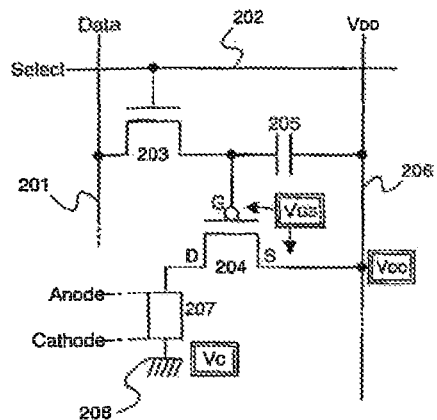
FIGS. 2A to 2D are diagrams for illustrating the operation in the case of forming the TFTs to be unipolar by the traditional configuration.
Figure 2B:
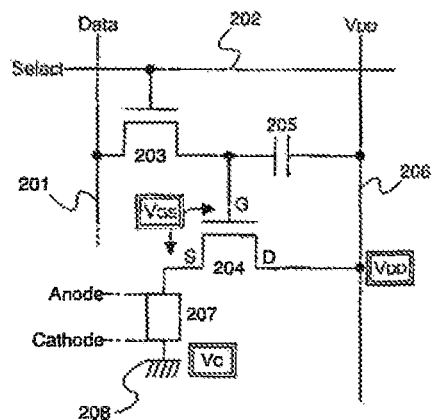
Figure 2C:
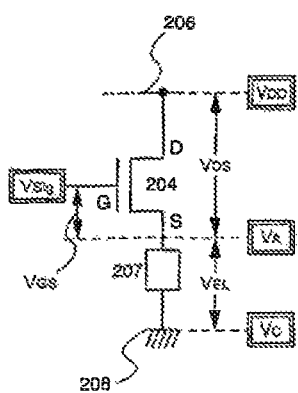
Figure 2D:
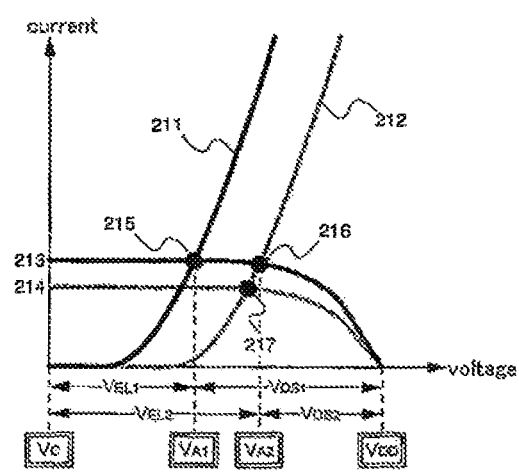

Based on the operation, the operation according to the deteriorated EL element or not will be considered with FIG. 1B. FIG. 1B schematically depicts that 151 is the potential of the gate signal line 102, 152 and 153 are the potential $V_G$ of the gate electrode of the TFT 104, 154 and 155 are the anode potential $V_A$ of the EL element 108, i.e. the source potential of the TFT 104, and 156 is the gate-source voltage $V_{GS}$ of the TFT 104.

Now, in the section expressed by i shown in FIG. 1B, the gate signal line 102 is selected to be at high level. Therefore, video signals are written in this section, and the gate potential $V_G$ of the TFT 104 rises. In the meantime, the TFT 105 is on, and thus the anode potential $V_A$ of the EL element 108, i.e. the source potential of the TFT 104 becomes equal to $V_{SS}$. Thus, the gate-source voltage $V_{GS}$ of the TFT 104 becomes larger. Furthermore, when it is $V_A=V_{SS} < V_C$ in the section, the EL element 108 does not emit light regardless of the value of the video signal $V_{Sig}$.

In the timing expressed by ii, the selection of the gate signal line 102 is finished to be at low level, and the TFTs 103 and 105 are turned off. $V_{GS}=(V_{Sig}-V_A)$ at this time is held in the capacitance element 106.

Subsequently, go into the section expressed by iii, and the light emission is started. At this time, when the gate-source voltage $V_{GS}$ of the TFT 104 exceeds the threshold, the TFT 104 is turned on to carry the drain current, and the EL element 108 emits light. At the same time, the source potential of the TFT 104 also rises. Here, as described above, the gate electrode of the TFT 104 is in the floating state, and thus the potential rises as similar to the rise in the source potential of the TFT 104.

Here, the case where the EL element 108 has been deteriorated will be considered. When the EL element is deteriorated, anode-cathode voltage becomes large in carrying a current of a certain value through the EL element 108 as described above. Thus, $V_A$ rises as expressed by 155. However, in the invention, $V_G$ also rises by the rise of $V_A$, and consequently, it is revealed that $V_{GS}$ is not changed.

Figure 7A:
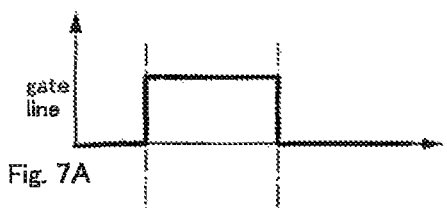
FIGS. 7A to 7H are diagrams comparing the invention with the traditional example on the change in the potential around the gate electrode and the source region of the driving TFT.
Figure 7B:
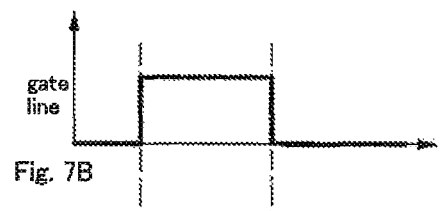
Figure 7C:
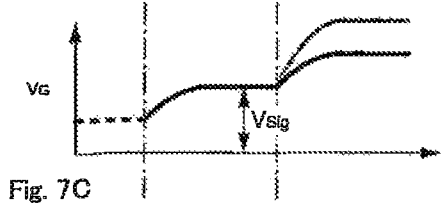
Figure 7D:
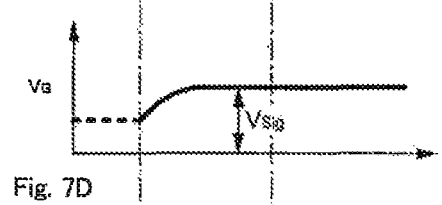
Figure 7E:
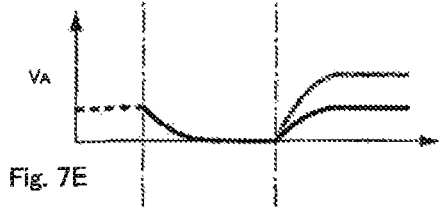
Figure 7F:
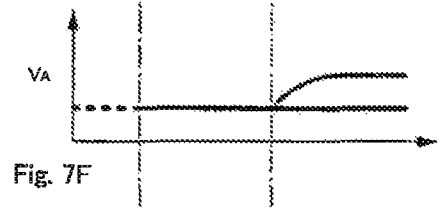
Figure 7G:
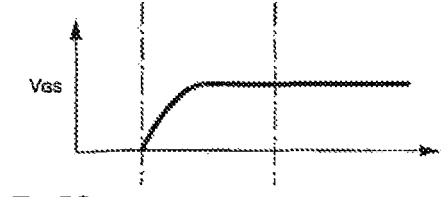
Figure 7H:
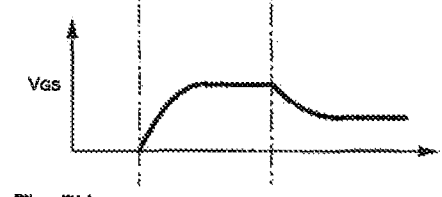
Figure 8:
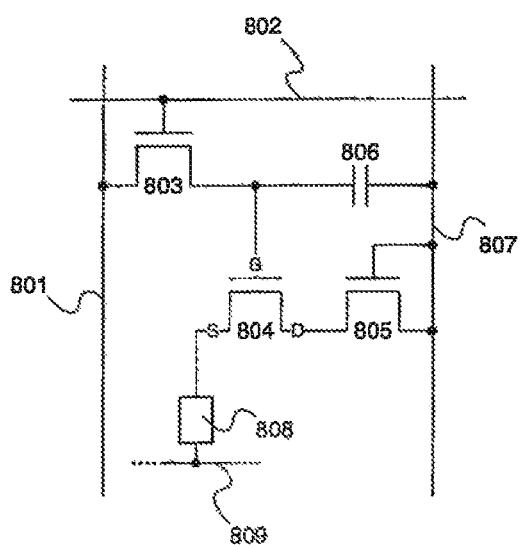
FIG. 8 is a diagram introducing one example of the pixel configured of the unipolar TFTs.

On the other hand, as shown in FIGS. 7A to 7H, in the case of the traditional configuration shown in FIG. 21, when video signals are once inputted and the potential is turned to be $V_{Sig}$, the gate potential $V_G$ of the TFT 204 is not changed after that. Therefore, the EL element 207 is deteriorated and $V_A$ rises, the gate-source voltage of the TFT 204 becomes smaller than before deteriorated (FIGS. 7G and 7H). In such the case, even though the TFT 204 is operated in the saturation region, the current value at the operating point is to be changed. Accordingly, when the EL element 207 is deteriorated and the voltage-current characteristics are changed, the current carried through the EL element 207 becomes smaller to cause the luminance to be decreased.

As described above, the current value is not changed even in the deterioration of the EL element, whereby the invention can eliminate the influence of the deterioration of the EL element.

In addition, both the potential $V_{SS}$ and $V_C$ of the power source lines can be set arbitrarily. Therefore, $V_{SS} < V_C$ is set, whereby the reverse bias can be easily applied to the EL element.

Furthermore, TFTs 103 and 105 are fine to simply function as the switching element, and thus the polarity is not defined. More specifically, even though all the TFTs configuring the pixel are set to be unipolar, the normal operation is feasible. In FIG. 1A, the TFTs 103 and 105 are set to have the same polarity and are controlled only by the gate signal line 102. However, it is acceptable that first and second gate signal lines different from each other are used to control the separate TFTs. In this cue, the TFTs 103 and 105 may have the different polarity each other. However, in consideration of the numerical aperture of the pixel, the number of lines for wiring is desired to be a smaller number as much as possible.

Embodiment 2

According to the configuration shown in FIG. 1A, for the lines routed to the pixel part, five lines were needed: the source signal line, the gate signal line, the current supply line ($V_{DD}$), the power source line ($V_C$), and the power source line ($V_{SS}$). In this embodiment, the configuration will be described in which lines for wiring are shared, whereby allowing the number of lines for wiring per pixel to be reduced and high numerical aperture to be obtained.

Figure 9:
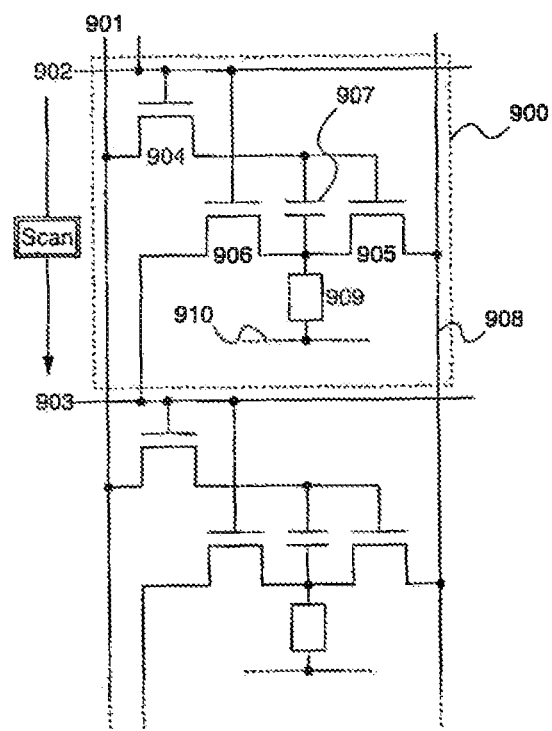
FIG. 9 is a diagram depicting an embodiment of the invention.

FIG. 9 depicts the configuration of the embodiment. The point different from the embodiment 1 is only the point in that the second electrode of a TFT 906 is connected to the power source line ($V_{SS}$) but it is connected to the gate signal line in a pixel of the next row in the embodiment. Suppose the pixel expressed by a dotted frame 900 is in the ith row, the second electrode of the TFT 906 is connected to the gate signal line in the i+1st row.

As the pulse condition of selecting the gate signal line, it is acceptable that the gate-source voltage of the TFT 904 sufficiently exceeds the threshold at high level. More specifically, it is acceptable that the potential is sufficiently larger than the threshold to the maximum value of the video signal $V_{Sig}$. In the meantime, the potential is fine to surely turn off the TFT 904 at low level. Accordingly, the potential at low level is set equal to $V_{SS}$ in the gate signal line.

When the ith gate signal line is selected to be at high level and the TFTs 904 and 906 are turned on, the i+1st gate signal line is not selected yet. More specifically, it is at low level and the potential is $V_{SS}$. Therefore, the anode potential $V_A$ of the EL element becomes equal to $V_{SS}$ through the TFT 906 as similar to the embodiment. Accordingly, when the lines for wiring are shared in accordance with the embodiment, the same effect as the embodiment 1 can be attained.

In addition, where to connect the second electrode of the TFT 906 is not limited to the i+1st gate signal line, when it is a position where a fixed potential $V_{SS}$ can be applied while the ith gate signal line is selected to be at high level and the TFT 906 is on. For example, it may be the i–1st gate signal line or other than this. When the signal lines in the adjacent rows are shared, the pulse of the signal lines are desired not to be overlapped each other.

Furthermore, as described in the embodiment 1, the TFTs 904 and 906 are fine to simply function as the switching elements. Thus, the polarity is not defined, which is not limited to being controlled by a single gate signal line 902 as shown in FIG. 9.

Embodiment 3

It is called the analogue gray scale system that the gate-source voltage of a driving TFT is controlled, and the current value carried through an EL element is controlled by analogue quantity for display. In the meantime, the digital gray scale system is proposed in which an EL element is driven only by two states, a hundred or zero percent luminance. In this system, only two levels of gray scale, black and white, can be displayed, but it has a merit of hardly being subject to variations in the TFT characteristics. To intend to have the multiple gray scale by the digital gray scale system, a driving method of combining with the time gray scale system is used. The time gray scale system is the method of expressing the gray scale by the length of time that the element emits light for a long time or short time.

Figure 10A:
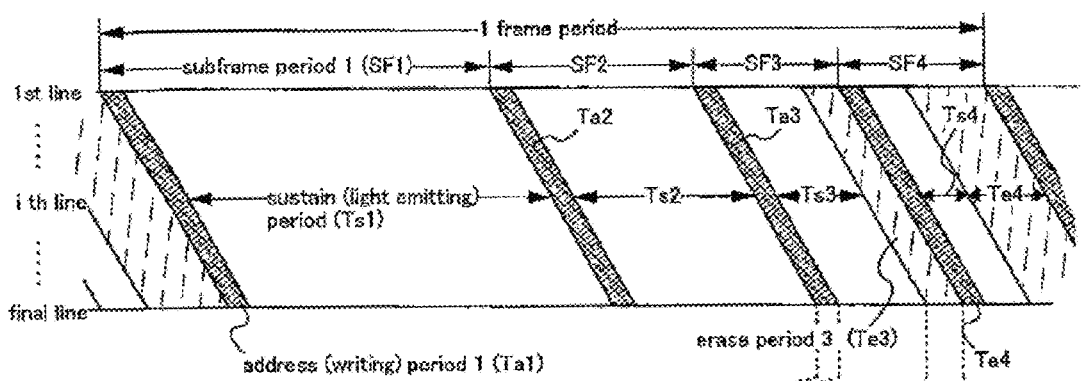
FIGS. 10A and 10B are diagrams for illustrating the time gray scale system.
Figure 10B:
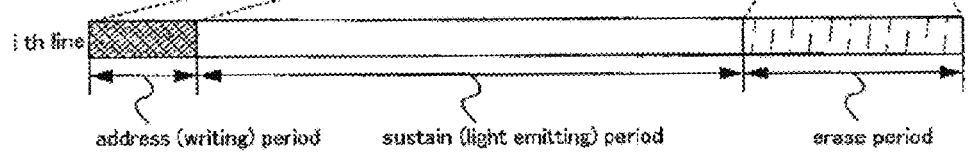

When the digital gray scale system is combined with the time gray scale system, one frame period is split into a plurality of subframe periods as shown in FIG. 10A. Each subframe period has the address (writing) period, the sustain (light emission) period, and the erase period, as shown in FIG. 10B. The gray scale is expressed in which the subframe periods corresponding to the bit numbers for display are disposed, the length of the sustain (light emission) period is set to $2^{(n-1)}:2^{(n-2)}: \ldots :2:1$ in each subframe period, the EL element is selected to emit light or not to emit light in each sustain (light emission) period, and the difference in the length of the total time while the EL element is emitting light is utilized. The luminance is high when the time for emitting light is long, whereas the luminance is low when short. In addition, FIGS. 10A and 10B depict the example of four bit gray scale in which one frame period is split into four subframe periods and $2^4=16$ levels of gray scale can be expressed by the combination of the sustain (light emission) periods. Furthermore, the gray scale can be expressed without particularly setting the ratio of the length of the sustain periods to be the ratio of the powers of two. Moreover, a certain subframe period may be further split.

When the multiple gay scale is intended with the time gray scale system, the length of the sustain (light emission) period of lower bits becomes further shorter. Therefore, when the subsequent address period is to start immediately after the sustain (light emission) period is finished, the period of overlapping with the address (writing) periods of the different subframe periods is generated. In this case, video signals inputted to a certain pixel are also inputted to the different pixel at the same time, and thus the normal display cannot be performed. The erase period is disposed for solving such the problem. As shown in FIG. 10B, it is disposed after Ts3 and Ts4 so as not to overlap two different address (writing) periods with each other. Accordingly, the erase period is not disposed in SF1 and SF2 where the sustain (light emission) period is long enough and the two different address (writing) periods will not overlap with each other.

In this manner, to drive the EL element by the method of combining the digital gray scale system with the time gray scale system, there might be the case of adding the operation that the light emission of the EL element is forcedly stopped and the erase period is disposed.

Figure 4A:
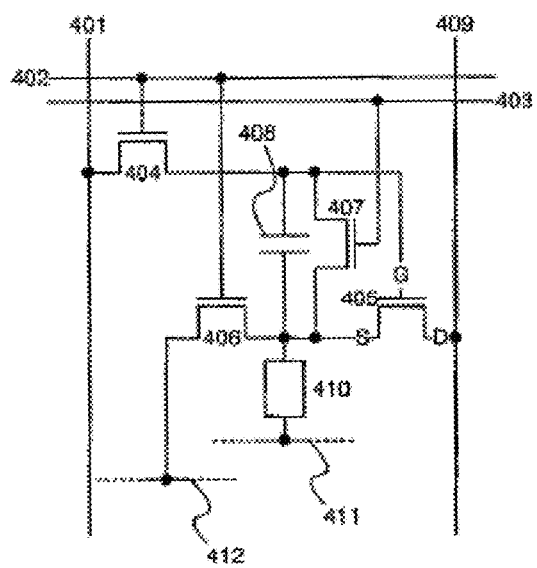
FIGS. 4A to 4C are diagrams for illustrating an embodiment of the invention and the operation.
Figure 4B:
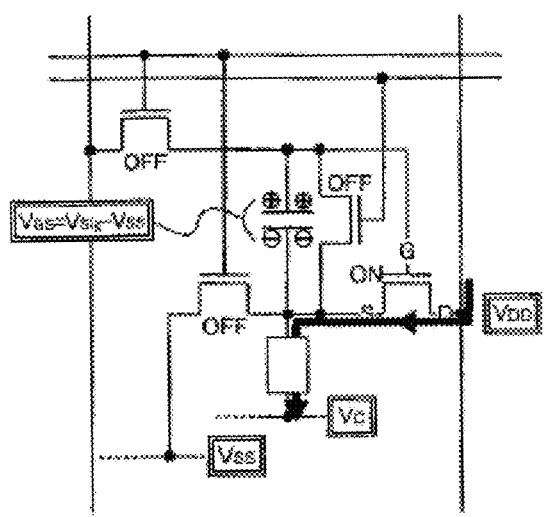

FIG. 4A depicts an example of adding a second gate signal line 403 and an erasing TFT 407 to the pixel having the configuration shown in the embodiment 1 to respond to the driving method of combining the digital gray scale system with the time gray scale system. The gate electrode of the erasing TFT 407 is connected to the second gate signal line 403, the first electrode of the erasing TFT 407 is connected to the gate electrode of a TFT 405 and the first electrode of a capacitance element 408, and the second electrode of the erasing TFT 407 is connected to the second electrode of the TFT 405 and the second electrode of the capacitance element 408.

The operation that a first gate signal line 402 is selected to input video signals is the same as that shown in the embodiment 1, thus omitting it here. In addition, during the input of the video signals, the second gate signal line is at low level and the erasing TFT 407 is off. At this time, $V_{Sig}$ takes either the potential to surely turn on the TFT 405 or potential to turn off the TFT 405.

Figure 11A:
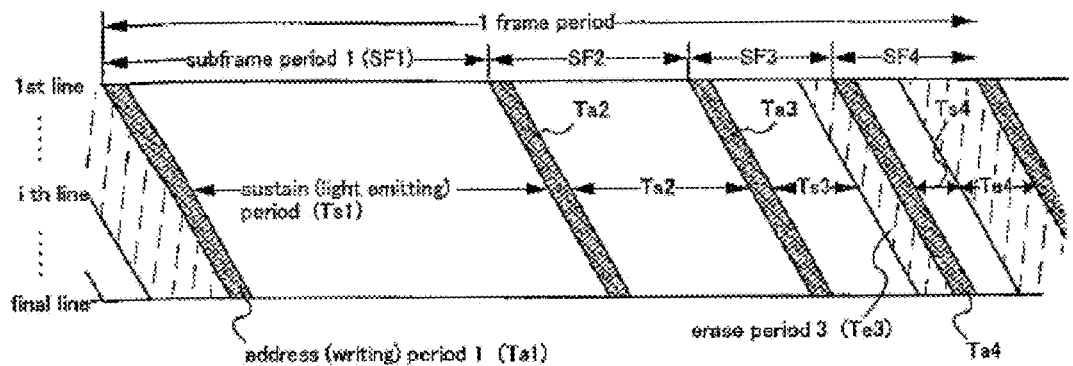
Figure 11B:
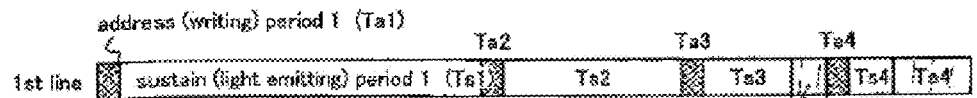

Here, the operation from the sustain (light emission) period to the erase period will be describe with FIGS. 4A to 4C and 11A to 11C. FIG. 1A is the same as that shown in FIG. 10A. As shown in FIG. 11B, one frame period has four subframe periods. In subframe periods SF3 and SF4 having a short sustain (light emission) period, they have erase periods Te3 and Te4, respectively. Here, the operation in SF3 will be exemplified for description.

Figure 4C:
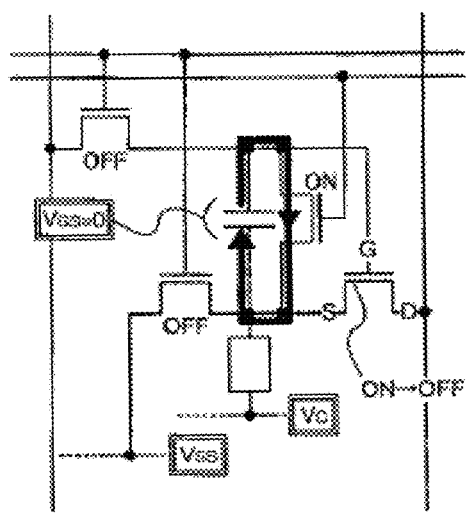

After the video signals are finished to input, the current corresponding to the gate-source voltage $V_{GS}$ of the TFT 405 is carried through an EL element 410 to emit light, as shown in FIG. 10B. Then, when timing is reached to finish the sustain (light emission) period, pulses are inputted to the second gate signal line 403 to be at high level, and the erasing TFT 407 is turned on to set the gate-source voltage $V_{GS}$ of the TFT 405 to be zero, as shown in FIG. 4C. Accordingly, the TFT 405 is turned off, the current to the EL element 410 is broken, and the EL element 410 forcedly stops light emission.

Figure 11C:
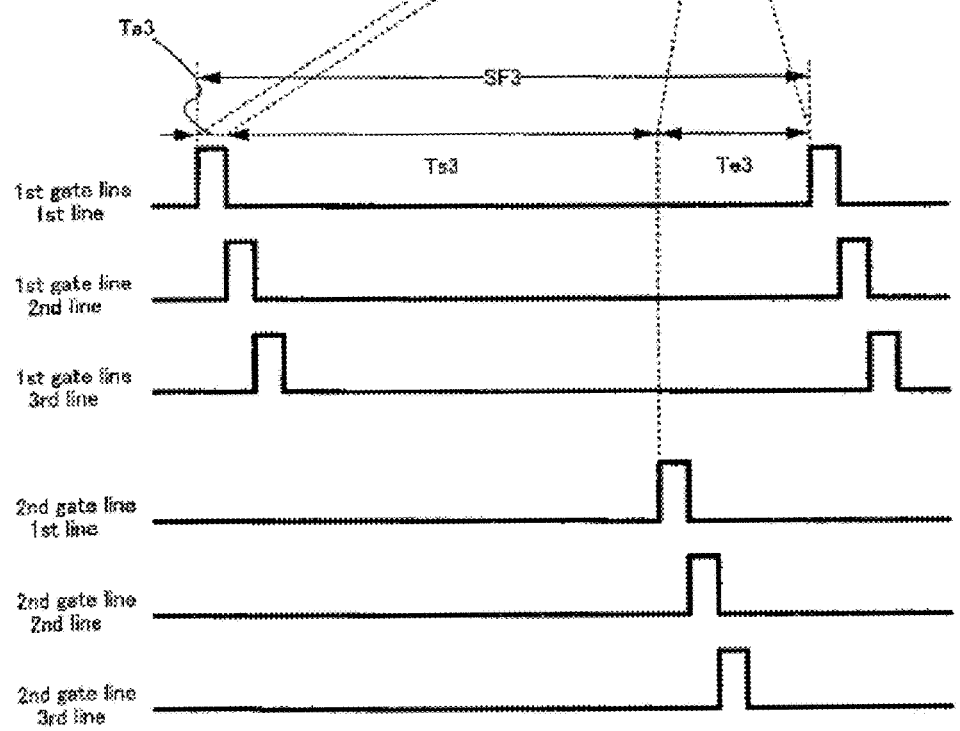

The operation is shown in FIG. 11C as a timing chart. The erase period Te3 is the period that after the sustain (light emission) period Ts3, a pulse is inputted to the second gate signal line 403, the EL element 410 stops light emission, and then a pulse is again inputted to the first gate signal line 402 to start inputting the next video signal.

In addition, in the configuration shown in FIG. 4A, the second electrode of a TFT 406 is connected to a power source line 412, but the power source line 412 can be substituted by the gate signal line in the adjacent row as shown in the embodiment 2. Furthermore, in the embodiment, the second gate signal line 403 is disposed for controlling the erasing TFT 407, and thus the second electrode of the TFT 406 may be connected to the second gate signal line 403.

Although the TFTs 404 and 406 are controlled by the gate signal line 402, a new gate signal line may be added. In this case, the TFTs 404 and 406 can be controlled by the gate signal line 402 and the newly added gate signal line, respectively.

Embodiment 4

Figure 5A:
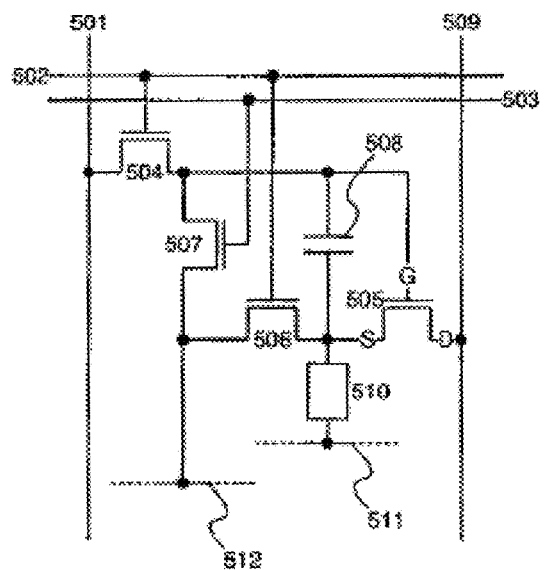
FIGS. 5A to 5C are diagrams for illustrating an embodiment of the invention and the operation.
Figure 5B:
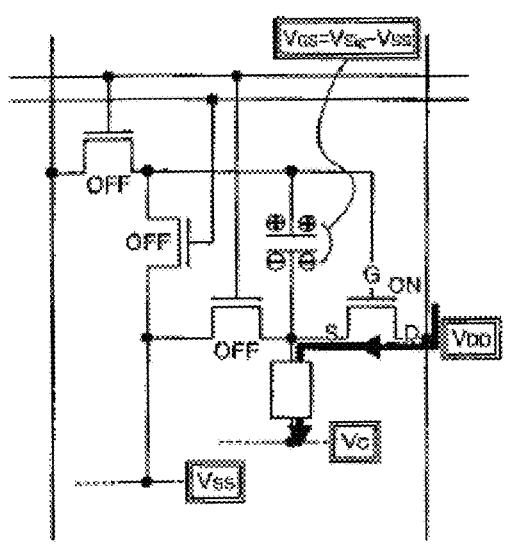

FIG. 5A depicts an example of disposing the erasing TFT at the position different from that shown in the embodiment 3. In this embodiment, an erasing TFT 507 is disposed between the gate electrode of a TFT 505 to the first electrode of a capacitance element 508 and a power source line 512.

The driving method is acceptable to be conducted by the method of combining the digital gray scale with the time gray scale system regarding from the input of video signals to light emission as similar to the embodiment 3. Thus, the description is omitted here, and the operation in the erase period will be described.

Figure 5C:
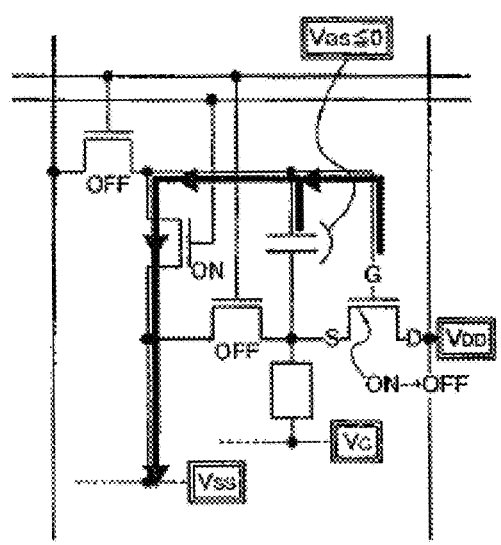

When timing is reached to finish the sustain (light emission) period, a pulse is inputted to a second gate signal line 503 to be at high level, the erasing TFT 507 is turned on, and the potential of the gate electrode of the TFT 505 is turned to be $V_{SS}$, as shown in FIG. 5C. More specifically, in the erase period, the gate-source voltage $V_{GS}$ of the TFT 505 is fine to be set below the threshold.

The source potential of the TFT 505 is in the potential at least equal to or greater than $V_{SS}$. Therefore, the operation of the erasing TFT 507 allows the gate-source voltage $V_{GS}$ of the TFT 505 to be $V_{GS} \leq 0$, and the TFT 505 is turned off. Accordingly, the erase period is the period that the EL element 510 stops light emission, a pulse is again inputted to a first gate signal line 502, and the next video signal is again started to input.

In addition, in the configuration shown in FIG. 5A, the second electrode of a TFT 506 is connected to the power source line 512, but the power source line 512 can be substituted by the gate signal line in the adjacent row as shown in the embodiment 2. Furthermore, in the embodiment, the second gate signal line 503 is disposed for controlling the erasing TFT 507. Thus, the second electrode of the TFT 506 may be connected to the second gate signal line 503.

Although the TFTs 504 and 506 are controlled by the gate signal line 502, a new gate signal line may be added. In this case, the TFTs 504 and 506 can be controlled by the gate signal line 402 and the newly added gate signal line, respectively.

Embodiment 5

FIG. 6A depicts an example of disposing the erasing TFT at the position different from that shown in the embodiments 3 and 4. In this embodiment, an erasing TFT 607 is disposed between the first electrode of a TFT 605 and a current supply line.

The operation of the circuit will be described. A first gate signal line 602 is selected to be at high level, a TFT 604 is turned on, and video signals are inputted to a pixel from a source signal line 601. In the meantime, a TFT 606 is also turned on to allow the anode potential $V_A$ of an EL element 610 to be equal to $V_{SS}$. At this time, when $V_{SS} \leq V_C$ is set, current is not carried though the EL element 610 in writing the video signals, and thus the TFT 607 is fine to be on or off.

When the input of video signals is finished and the first gate signal line 602 is not selected, the gate electrode of the TFT 605 is in the floating state and the migration path for stored charges is blocked in a capacitance element 608. Thus, the gate-source voltage $V_{GS}$ is held in the capacitance element 608.

Subsequently, a second gate signal line 603 is selected to be at high level and the TFT 607 is turned on, whereby current is carried as shown in FIG. 6D, the anode potential $V_A$ of the EL element 610 rises to generate the potential difference with the cathode potential $V_C$, and the current is carried to emit light. In addition, it is acceptable that the TFT 607 is turned on from the state of inputting the video signals. In this case, at the moment that the first gate signal line 602 is turned not to be selected, current is supplied to the EL element 610 through the TFTs 607 and 605, and the anode potential $V_A$ of the EL element 610 rises to generate the potential difference with the cathode potential $V_C$, carrying the current to emit light.

When timing is reached to finish the sustain (light emission) period, the second gate signal line 603 is not selected to be at low level, the TFT 607 is turned off, and the current path from a current supply line 609 to the EL element 610 is blocked. Accordingly, the current is not carried through the EL element 610 to stop light emission. After that, the erase period is the period that a pulse is again inputted to the first gate signal line 602 and the next video signal is started to input.

In addition, the TFT 607 is fine to be disposed between the first electrode of the TFT 605 and the anode of the EL element 610. More specifically, it is acceptable that the TFT 607 is disposed in the current path between the current supply line 609 and the EL element 610 and the current supply to the EL element 610 can be cut during the erase period.

Although the TFTs 604 and 606 are controlled by the gate signal line 602, a new gate signal line may be added. In this case, the TFTs 604 and 606 can be controlled by the gate signal line 602 and the newly added gate signal line, respectively.

Embodiment 6

In the embodiments 3 to 5, the example of adding the TFT to dispose the erase period has been described, but in this embodiment, an example of performing the same operation will be described without adding the erasing TFT.

Figure 21A:
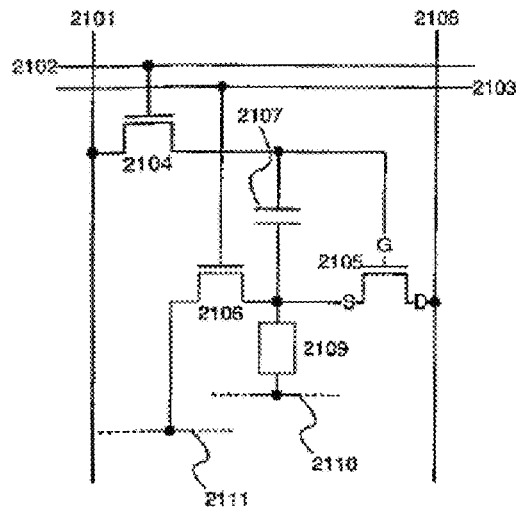
FIGS. 21A to 21C are diagrams for illustrating an embodiment of the invention and the operation.

FIG. 21A depicts the configuration. The configuration is nearly similar to that shown in the embodiment 1, but the difference is in that TFTs 2104 and 2106 are controlled by separate gate signal lines 2102 and 2103, respectively.

Figure 21B:
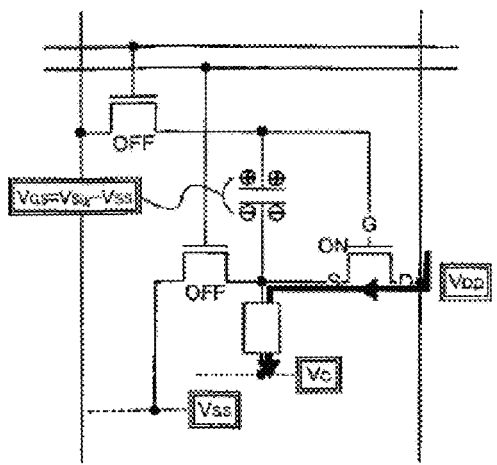

As shown in FIG. 21B, in the sustain (light emission) period, a capacitance element 2107 fixes the gate-source voltage of a TFT 2105 and the current accompanying this is carried through an EL element 2109 to emit light.

Figure 21C:
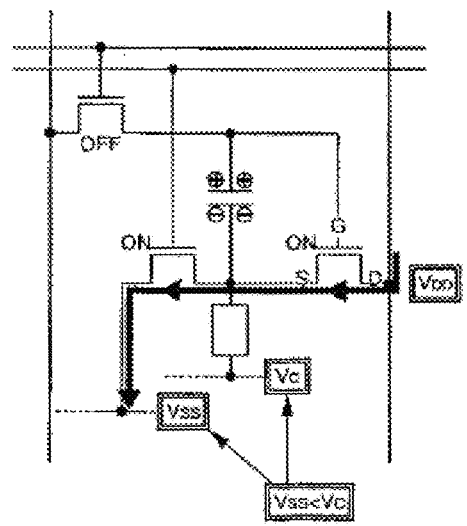

Subsequently, go to the erase period, and a pulse is inputted to the second gate signal line 2103 to turn on the TFT 2106. At this time, the potential of a power source line 2111 connected to the second electrode of the TFT 2106 is set lower than the cathode potential of the EL element 2109, i.e. the potential of a power source line 2110, whereby current is not carried through the EL element 2109. Accordingly, the current at this time is carried as shown in FIG. 21C.

In addition, the gate signal line in the adjacent row may be used for the power source line 2111 as described in the other embodiments.

Embodiment 7

Figure 12A:
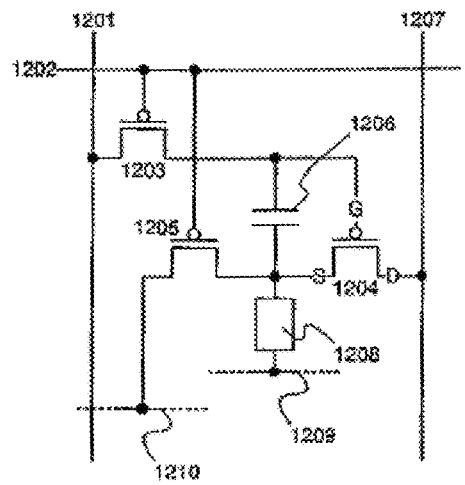
FIGS. 12A to 12D are diagrams for illustrating an embodiment of the invention and the operation.

The N-channel TFT has been used for the TFT for supplying current to the EL element. However, the invention can be implemented by using the P-channel TFT for the driving TFT. FIG. 12A depicts the exemplary configuration.

The circuit configuration is the same as that using the N-channel TFT shown in FIG. 1A. However, the differences are in that the configuration of an EL element 1208 is reverse, one side connected to the second electrode of the TFT 1204 is the cathode, and the other side connected to a power source line 1209 is the anode, and that the potential of a current supply line 1207 is $V_{SS}$, the potential of a power source line 1209 is $V_A$, and the potential of a power source line 1210 is $V_{DD}$. Here, it is $V_{SS}<V_{DD}$ and $V_A<V_{DD}$.

Figure 12B:
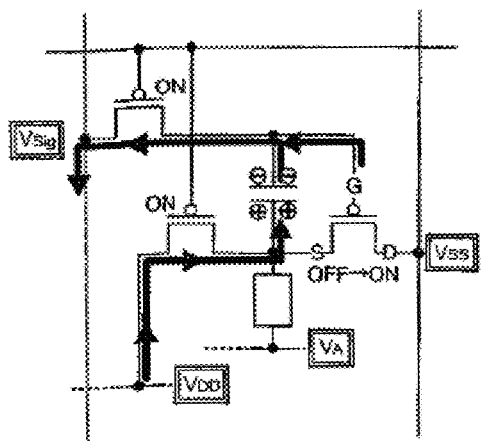
Figure 12C:
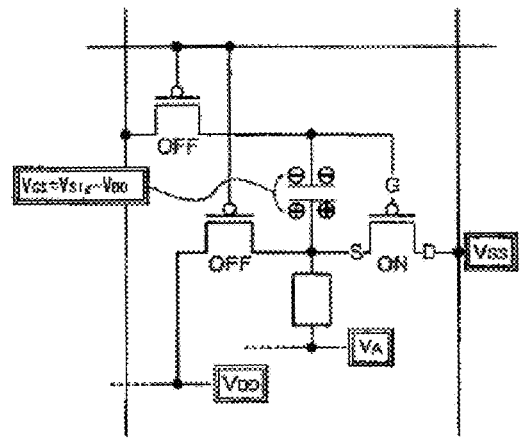
Figure 12D:
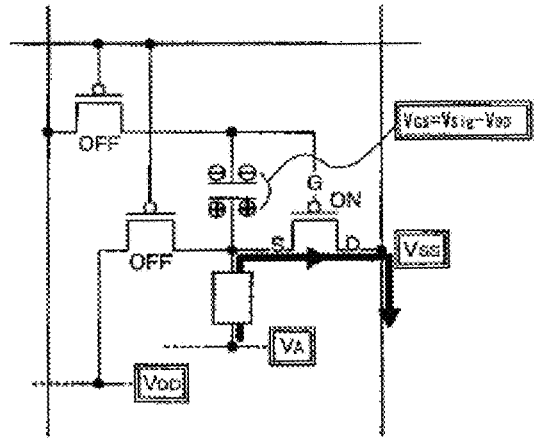

The operation of the circuit will be described with FIGS. 12B to 12D. In addition, the polarity of the TFTs is the P-channel type, a low level is inputted to the gate electrode to turn on the TFTs, and a high level is inputted to turn off the TFTs.

In a certain row, a gate signal line 1202 is selected to be at low level, and TFTs 1203 and 1205 are turned on. As shown in FIG. 12B, video signals are inputted to the gate electrode of the TFT 1204 from a source signal line 1201, and the potential is turned to be $V_{Sig}$. In the meantime, the TFT 1205 is on, and thus the cathode potential $V_C$ of the EL element 1208 is turned to be $V_C = V_{DD}$. At this time, when $V_A \geq V_{DD}$ is set, current is not carried through the EL element 1208 in writing the video signals. According to this operation, the voltage between both electrodes of a capacitance element 1206, that is, the gate-source voltage of the TFT 1204 is turned to be $(V_{Sig} - V_{DD})$. Then, when the select period of the gate signal line 1202 is finished to be at high level and the TFTs 1203 and 1205 are turned off, the migration path for charges stored in the capacitance element 1206 is gone and the gate-source voltage $(V_{Sig} - V_{DD})$ of the TFT 1204 is held (FIG. 12C).

Here, when $(V_{Sig} - V_{DD})$ is below the threshold of the TFT 1204, the TFT 1204 is turned on, current is carried through the power source line 1209, the EL element 1208 and the current supply line 1207 to start light emission (FIG. 12D), and the source potential of the TFT 1204 drops. At this time, the gate electrode of the TFT 1204 is in the floating state, and the capacitance element 1206 holds the gate-source voltage of the TFT 1204. Therefore, the potential of the gate electrode also drops with the decrease in the source potential.

In FIG. 12A, the P-channel TFT is used for all the TFTs configuring the pixel. However, the TFTs 1203 and 1205 are fine to simply function as the switching elements, as described in the other embodiments. Thus, the polarity is not defined. In addition, the TFTs 1203 and 1205 do not need to be driven only by the gate signal line 1202. Such the configuration is acceptable that the separate TFTs are controlled by another gate signal line.

EXAMPLES

Hereafter, the examples of the invention will be described.

Example 1

Figure 16A:
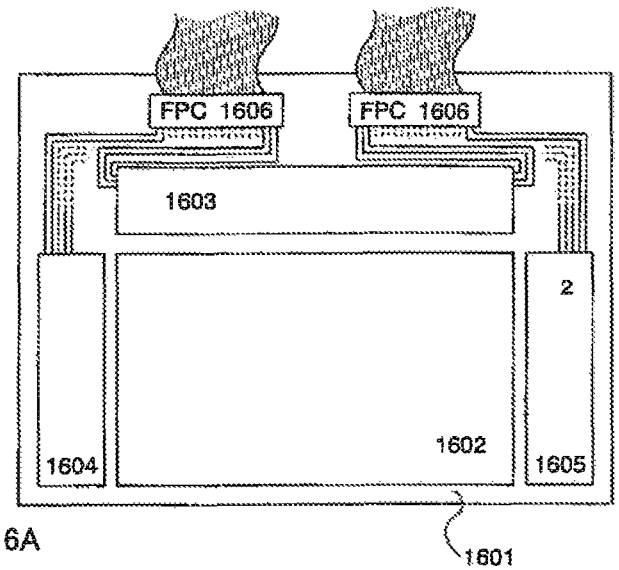
FIGS. 16A to 16C are diagrams depicting the configuration of a semiconductor device for display with analogue video signals.

In this example, the configuration of a light emitting device in which analogue as video signals are used for video signals for display will be described. FIG. 16A depicts the exemplary configuration of the light emitting device. The device has a pixel part 1602 where a plurality of pixels is arranged in a matrix shape over a substrate 1601, and it has a source signal line drive circuit 1603 and first and second gate signal line drive circuits 1604 and 1605 around the pixel part. Two gate signal line drive circuits are used in FIG. 16A. However, when one gate signal line is used in the pixel as shown in FIG. 1A, the gate signal line is controlled from both sides simultaneously. When two gate signal lines are used in the pixel shown in FIGS. 4A and 5A, the separate gate signal line drive circuits control the respective gate signal lines.

Signals inputted to the source signal line drive circuit 1603, and the first and second gate signal line drive circuits 1604 and 1605 are fed from outside through a flexible printed circuit (FPC) 1606.

Figure 16B:
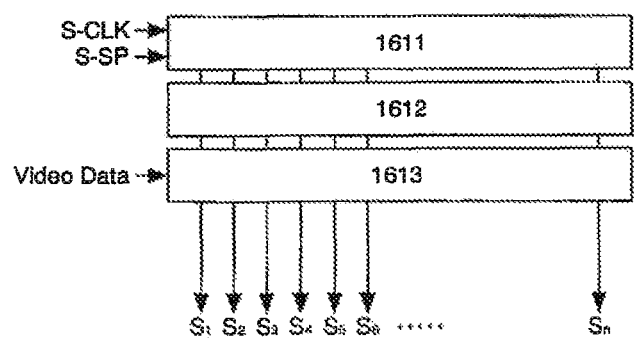

FIG. 16B depicts the exemplary configuration of the source signal line drive circuit. This is the source signal line drive circuit for using analogue video signals for video signals for display, which has a shift register 1611, a buffer 1612, and a sampling circuit 1613. Not shown particularly, but a level shifter may be added as necessary.

Figure 17A:
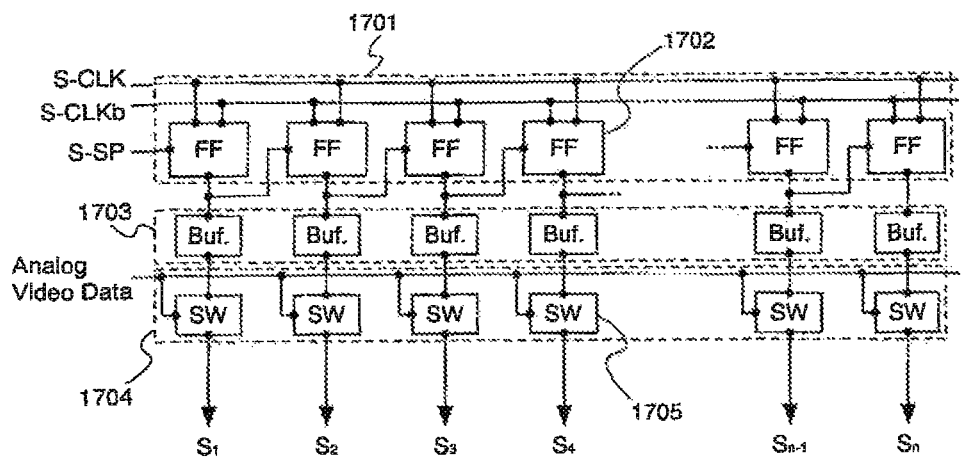
FIGS. 17A and 17B are diagrams depicting an example of a source signal line drive circuit and a gate signal line drive circuit in the device shown in FIGS. 16A to 16C.

The operation of the source signal line drive circuit will be described. FIG. 17A shows the more detailed configuration, thus referring to the drawing.

A shift register 1701 is formed of a plurality of flip-flop circuits (FF) 1702, to which the dock signal (S-CLK), the dock inverted signal (S-CLKb), and the start pulse (S-SP) are inputted. In response to the timing of these signals, sampling pulses are outputted sequentially.

The sampling pulses outputted from the shift register 1701 are passed through a buffer 1703 and amplified, and then inputted to a sampling circuit. The sampling circuit 1704 is formed of a plurality of sampling switches (SW) 1705, which samples video signals in a certain column in accordance with the timing of inputting the sampling pulses. More specifically, when the sampling pulses are inputted to the sampling switches, the sampling switches 1705 are turned on. The potential held by the video signals at this time is outputted to the separate source signal lines through the sampling switches.

Figure 16C:
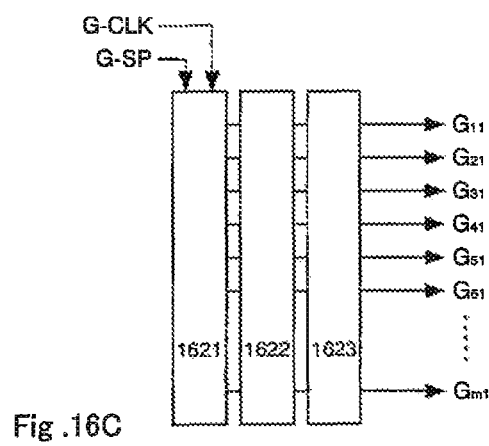
Figure 17B:
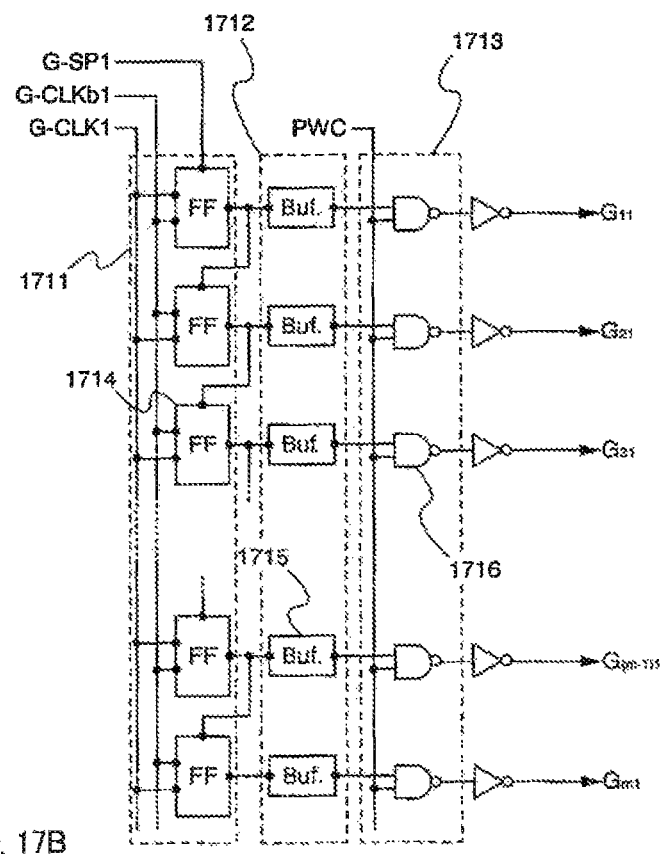

Subsequently, the operation of the gate signal line drive circuit will be described. FIG. 17B depicts the more detailed exemplary configuration of the first and second gate signal line drive circuits 1604 and 1605 shown in FIG. 16C. The first gate signal line drive circuit has a shift register circuit 1711, and a buffer 1712, which is driven in response to the dock signal (O-CLK), the dock inverted signal (G-CLKb1), and the start pulse (G-SP1). The second gate signal line drive circuit 1605 may also be configured similarly.

The operation from the shift register to the buffer is the same as that in the source signal line drive circuit. The sampling pulses amplified by the buffer select separate gate signal lines for them. The first gate signal line drive circuit sequentially selects first gate signal lines $G_{11}, G_{21}, \ldots$ and $G_{m1}$, and the second gate signal line drive circuit sequentially selects second gate signal lines $G_{12}, G_{22}, \ldots$ and $G_{m2}$. A third gate signal line drive circuit, not shown, is also the same as the first and second gate signal line drive circuits, sequentially selecting third gate signal lines $G_{13}, G_{22}, \ldots$ and $G_{m3}$. In the selected row, video signals are written in the pixel to emit light according to the procedures described in the embodiments.

In addition, as one example of the shift register, that formed of a plurality of D flip-flops is shown here. However such the configuration is acceptable that signal lines can be selected by a decoder.

Example 2

Figure 18A:
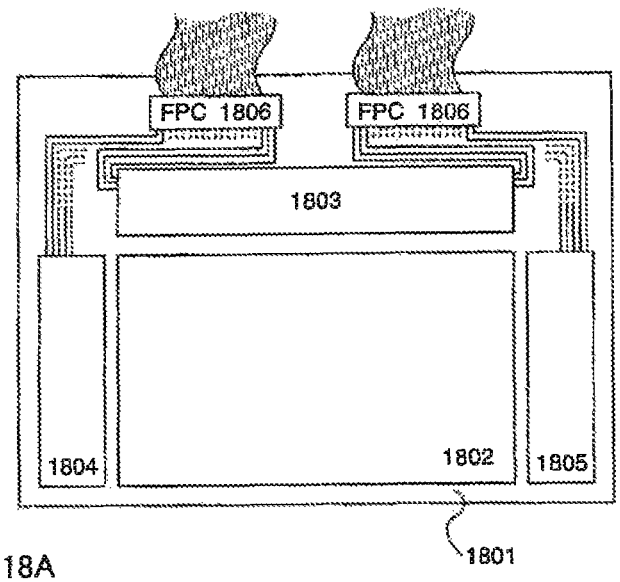
FIGS. 18A and 18B are diagrams depicting the configuration of a semiconductor device for display with digital video signals.

In this example, the configuration of a light emitting device in which digital video signals are used for video signals for display will be described. FIG. 18A depicts the exemplary configuration of a light emitting device. The device has a pixel part 1802 where a plurality of pixels is arranged in a matrix shape over a substrate 1801, and it has a source signal line drive circuit 1803, and first and second gate signal line circuits 1804 and 1805 around the pixel part. Two gate signal line drive circuits are used in FIG. 18A. However, when one gate signal line is used in the pixel as shown in FIG. 1A, the gate signal line is controlled from both sides simultaneously. When two gate signal lines are used in the pixel as shown in FIGS. 4A and 5A, the separate gate signal line drive circuits control the respective gate signal lines.

Signals inputted to the source signal line drive circuit 1803, and the first and second gate signal line drive circuits 1804 and 1805 are fed from outside through a flexible printed circuit (FPC) 1806.

Figure 18B:
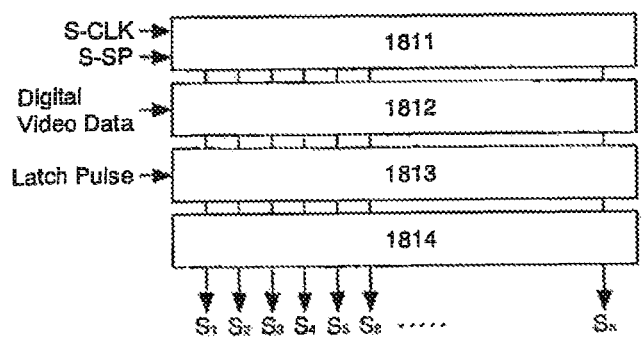

FIG. 18B depicts the exemplary configuration of the source signal line drive circuit. This is the source signal line drive circuit for using digital video signals for video signals for display, which has a shift register 1811, a first latch circuit 1812, a second latch circuit 1813, and a D/A converter circuit 1814. Not shown in the drawing particularly, but a level shifter may be added as necessary.

The first and second gate signal line drive circuits 1804 and 1805 are fine to be those shown in the example 1, thus omitting the illustration and description here.

Figure 19A:
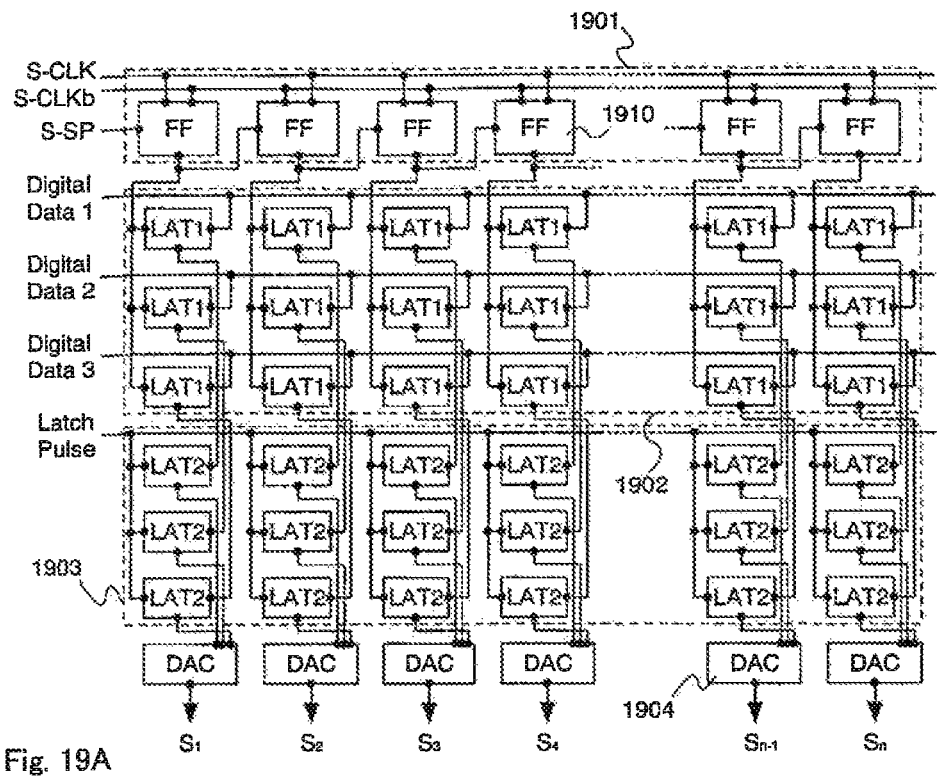
FIGS. 19A and 19B are diagrams depicting an example of a source signal line as drive circuit in the device shown in FIGS. 18A and 18B.

The operation of the source signal line drive circuit will be described. FIG. 19A shows the more detailed configuration, thus referring to the drawing.

A shift register 1901 is formed of a plurality of flip-flop circuits (FF) 1910, to which the clock signal (S-CLK), the clock inverted signal (S-CLKb), and the start pulse (S-SP) are inputted. Sampling pulses are sequentially outputted in response to the timing of these signals.

The sampling pulses outputted from the shift register 1901 are inputted to first latch circuits 1902. Digital video signals are being inputted to the first latch circuits 1902. The digital video signals are held at each stage in response to the timing of inputting the sampling pulses. Here, the digital video signals are inputted by three bits. The video signals at each bit are held in the separate first latch circuits. Here, three first latch circuits are operated in parallel by one sampling pulse.

When the first latch circuits 1902 finish to hold the digital video signals up to the last stage, latch pulses are inputted to second latch circuits 1903 during the horizontal retrace period, and the digital video signals held in the first latch circuits 1902 are transferred to the second latch circuits 1903 all at once. After that, the digital video signals held in the second latch circuits 1903 for one row are inputted to D/A converter circuits 1904 simultaneously.

While the digital video signals held in the second latch circuits 1903 are being inputted to the D/A converter circuits 1904, the shift register 1901 again outputs sampling pulses. Subsequent to this, the operation is repeated to process the video signals for one frame.

The D/A converter circuits 1904 convert the inputted digital video signals from digital to analogue and output them to the source signal line as the video signals having the analogue voltage.

The operation described above is conducted throughout the stages during one horizontal period. Accordingly, the video signals are outputted to the entire source signal lines.

In addition, as described in the example 1, such the configuration is acceptable that a decoder is used instead of the shift register to select signal lines.

Example 3

Figure 19B:
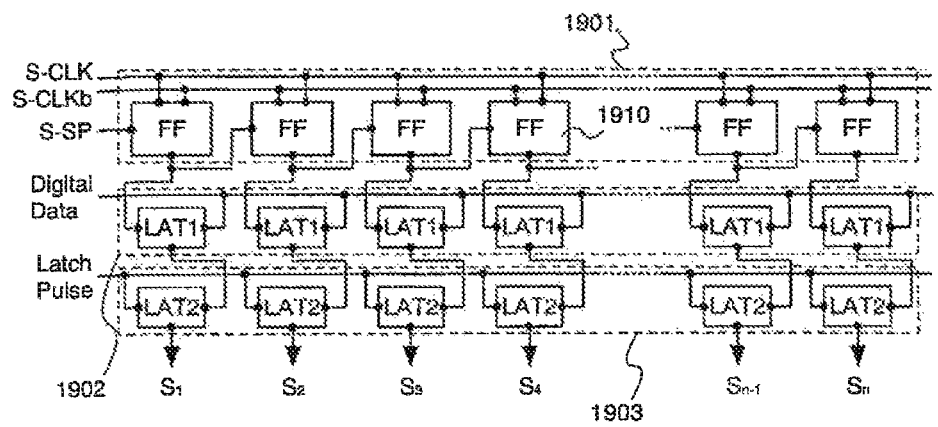

In the example 2, digital video signals are converted from digital to analogue by the D/A converter circuits and are written in the pixels. The semiconductor device of the invention can also express gray scales by the time gray scale system. In this case, the D/A converter circuits are not needed as shown in FIG. 19B, and gray scales are controlled over the expression by the length of time that the EL element is emitting light for a long tome or short time. Thus, the video signals of each bit do not need to undergo parallel processing. Therefore, both the first and second latch circuits are fine for one bit. At this time, the digital video signals of each bit are serially inputted, sequentially held in the latch circuits and written in the pixels. Of course, it is acceptable that latch circuits for necessary bits are arranged in parallel.

Example 4

In this specification, a substrate on which a driver circuit, a pixel part having TFTs for switching and TFTs for driving are formed, for the sake of convenience, is referred to as an active-matrix substrate. In this example, the active substrate manufactured by using unipolar TFTs will be described with reference to FIGS. 13 A to 14C.

A quartz substrate, a silicon substrate, a metallic substrate, or a stainless substrate, in which an insulating film is formed on the surface thereof is used as a substrate 5000. In addition, a plastic substrate having a heat resistance, which is resistant to a processing temperature in this manufacturing process may be used. In this example, the substrate 5000 made of glass such as barium bormosilicate glass or alumi-noborosilicate glass is used.

Next, a base film 5001 made from an insulating film such as a silicon oxide film, a silicon nitride film, or a silicon oxynitride film is formed on the substrate 5000. In this example, a two-layer structure is used for the base film 5001. However, a single layer structure of the insulating film or a structure in which two layers or more of the insulating film are laminated may be used.

In this example, as a first layer of the base film 5001, a silicon oxynitride film 5001a is formed at a thickness of 10 nm to 200 nm (preferably, 50 nm to 100 nm) by a plasma CVD method using $SiH_4$, $NH_3$, and $N_2O$ as reactive gases. In this example, the silicon oxynitride film 5001a is formed at a thickness of 50 nm. Next, as a second layer of the base film 5001, a silicon oxynitride film 5001b is formed at a thickness of 50 nm to 200 nm (preferably, 100 nm to 150 nm) by a plasma CVD method using $SiH_4$ and $N_2O$ as reactive gases. In this example, the silicon oxynitride film 5001b is formed at a thickness of 100 nm.

Subsequently, semiconductor layers 5002 to 5005 are formed on the base film 5001. The semiconductor layers 5002 to 5005 are formed as follows. That is, a semiconductor film is formed at a thickness of 25 nm to 80 nm (preferably, 30 nm to 60 nm) by known means (such as a sputtering method, an LPCVD method, or a plasma CVD method). Next, the semiconductor film is crystallized by a known crystallization method (such as a laser crystallization method, a thermal crystallization method using RTA or a furnace anneal furnace, a thermal crystallization method using a metallic element for promoting crystallization, or the like). Then, the obtained crystalline semiconductor film is patterned in a predetermined shape to form the semiconductor layers 5002 to 5005. Note that an amorphous semiconductor film, a micro-crystalline semiconductor film, a crystalline semiconductor film, a compound semiconductor film having an amorphous structure such as an amorphous silicon germanium film, or the like may be used as the semiconductor film.

In this example, an amorphous silicon film having a film thickness of 55 nm is formed by a plasma CVD method. A solution containing nickel is held on the amorphous silicon film and it is dehydrogenated at 500° C. for 1 hour, and then thermal crystallization is conducted at 550° C. for 4 hours to form a crystalline silicon film. After that, patterning processing using a photolithography method is performed to form the semiconductor layers 5002 to 5005.

Note that, when the crystalline semiconductor film is formed by a laser crystallization method, a gas laser or a solid laser, which conducts continuous oscillation or pulse oscillation is preferably used as the laser. An excimer laser, a YAG laser, a $YVO_4$ laser, a YLF laser, a $YAlO_3$ laser, a glass laser, a ruby laser, a Ti:sapphire laser, and the like can be used as the former gas laser. In addition, a laser using a crystal such as YAG, $YVO_4$, YLF or $YAlO_3$, which is doped with Cr, Nd, Er, Ho, Ce, Co, Ti, or Tm can be used as the latter solid laser. The fundamental of the laser is to changed according to a doping material and laser light having a fundamental of the neighborhood of 1 µm is obtained. A harmonic to the fundamental can be obtained by using a non-linear optical element. Note that, in order to obtain a crystal having a large grain size at the crystallization of the amorphous semiconductor film, it is preferable that a solid laser capable of conducting continuous oscillation is used and a second harmonic to a fourth harmonic of the fundamental are applied. Typically, a second harmonic (532 am) or a third harmonic (355 nm) of an $Nd:YVO_4$ laser (fundamental of 1064 nm) is applied.

Also, laser light emitted from the continuous oscillation $YVO_4$ laser having an output of 10 W is converted into a harmonic by a non-linear optical element. Further, there is a method of locating an $YVO_4$ crystal and a non-linear optical element in a resonator and emitting a harmonic. Preferably, laser light having a rectangular shape or an elliptical shape is formed on an irradiation surface by an optical system and irradiated to an object to be processed. At this time, an energy density of about 0.01 $MW/cm^2$ to 100 $MW/cm^2$ (preferably, 0.1 $MW/cm^2$ to 10 MW/cm) is required. The semiconductor him is moved relatively to the laser light at a speed of about 10 cm/s to 2000 cm/s to be irradiated with the laser light.

Also, when the above laser is used, it is preferable that a laser beam emitted from a laser oscillator is linearly condensed by an optical system and irradiated to the semiconductor film. A crystallization condition is set as appropriate. When an excimer laser is used, it is preferable that a pulse oscillation frequency is set to 300 Hz and a laser energy density is set to 100 $mJ/cm^2$ to 700 $mJ/cm^2$ (typically, 200 $mJ/cm^2$ to 300 $mJ/cm^2$). In addition, when a YAG laser is used, it is preferable that the second harmonic is used, a pulse oscillation frequency is set to 1 Hz to 300 Hz, and a laser energy density is set to 300 $mJ/cm^2$ to 1000 $mJ/cm^2$ (typically, 350 $mJ/cm^2$ to 500 $mJ/cm^2$). A laser beam linearly condensed at a width of 100 µm to 1000 µm (preferably, 400 µm) is irradiated over the entire surface of the substrate. At this time, an overlap ratio with respect to the linear beam may be set to 50% to 98%.

However, in this example, the amorphous silicon film is crystallized using a metallic element for promoting crystallization so that the metallic element remains in the crystalline silicon film. Thus, an amorphous silicon film having a thickness of 50 nm to 100 nm is formed on the crystalline silicon film, heat treatment (thermal anneal using an RTA method or a furnace anneal furnace) is conducted to diffuse the metallic element into the amorphous silicon film, and the amorphous silicon film is removed by etching after the heat treatment. As a result, the metallic element contained in the crystalline silicon film can be reduced or removed.

Note that, after the formation of the semiconductor layers 5002 to 5005, doping with a trace impurity element (boron or phosphorus) may be conducted in order to control a threshold value of a TFT.

Next, a gate insulating film 5006 covering the semiconductor layers 5002 to 5005 is formed. The gate insulating film 5006 is formed from an insulating film containing silicon at a film thickness of 40 m to 150 nm by a plasma CVD method or a sputtering method. In this example, a silicon oxynitride film is formed as the gate insulating film 5006 at a thickness of 115 nm by the plasma CVD method. Of course, the gate insulating film 5006 is not limited to the silicon oxynitride film. Another insulating film containing silicon may be used as a single layer or a laminate structure.

Note that, when a silicon oxide film is used as the gate insulating film 5006, a plasma CVD method is employed, TEOS (tetraethyl orthosilicate) and $O_2$ are mixed, a reactive pressure is set to 40 Pa, and a substrate temperature is set to 300° C. to 400° C. Then, discharge may occur at a high frequency (13.56 MHz) power density of 0.5 $W/cm^2$ to 0.8 $W/cm^2$ to form the silicon oxide film. After that, when thermal anneal is conducted for the silicon oxide film formed by the above stops at 400° C. to 500° C., a preferable property as to the gate insulating film 5006 can be obtained.

Next, a first conductive film 5007 having a film thickness of 20 nm to 100 nm and a second conductive film 5008 having a film thickness of 100 nm to 400 nm are laminated on the gate insulating film 5006. In this example, the first conductive film 5007, which has the film thickness of 30 nm and is made from a TaN film and the second conductive film 5008, which has the film thickness of 370 nm and is made from a W film are laminated.

In this example, the TaN film as the first conductive film 5007 is formed by a sputtering method using Ta as a target in an atmosphere containing nitrogen. The W film as the second conductive film 5008 is formed by a sputtering method using W as a target. In addition, it can be formed by a thermal CVD method using tungsten hexafluoride ($WF_6$). In any case, when they are used for a gate electrode, it is necessary to reduce a resistance, and it is desirable that a resistivity of the W film is set to 20 µΩ cm or lower. When a crystal grain is enlarged, the resistivity of the W film can be reduced. However, if a large number of impurity elements such as oxygen exist in the W film, the crystallization is suppressed so that the resistance is increased. Therefore, in this example, the W film is formed by a sputtering method using high purity W (purity of 99.9999%) as a target while taking into a consideration that an impurity does not enter the film from a gas phase at film formation. Thus, a resistivity of 9 µΩ to 20 µΩ cm can be realized.

Note that, in this example, the TaN film is used as the first conductive film 5007 and the W film is used as the second conductive film 5008. However, materials that compose the first conductive film 5007 and the second conductive film 5008 are not particularly limited. The first conductive film 5007 and the second conductive film 5008 each may be formed from an element selected from Ta, W, Ti, Mo, Al, Cu, Cr, and Nd, or an alloy material or a compound material, which contains mainly the above element. In addition, they may be formed from a semiconductor film that is represented by a polycrystalline silicon film doped with an impurity element such as phosphorus, or an AgPdCu alloy.

Figure 13A:
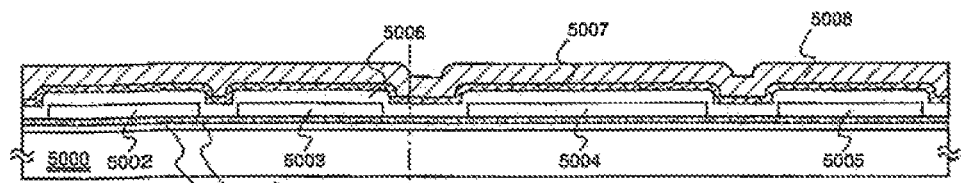
FIGS. 13A to 13D are diagrams for illustrating the fabrication processes of a semiconductor device.
Figure 13B:
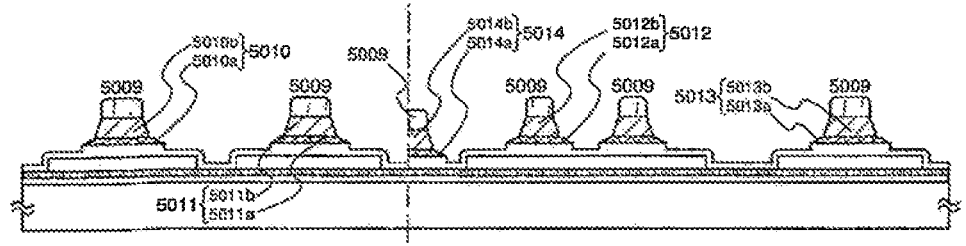

Next, a mask 5009 made of a resist is formed by using a photolithography method and first etching processing for forming electrodes and wirings is performed. The first etching processing is performed under a first etching condition and a second etching condition (FIG. 13B).

In this example, as the first etching condition, an ICP (inductively coupled plasma) etching method is used. In addition, $CF_4$, $Cl_2$, and $O_2$ are used as etching gases and a ratio of respective gas flow rates is set to 25:25:10 (sccm). RF power having 500 W and 13.56 MHz is supplied to a coil type electrode at a pressure of 1.0 Pa to produce plasma, thereby conducting etching. RF power having 150 W and 13.56 MHz is supplied to a substrate side (sample stage) to apply a substantially negative self bias voltage thereto. The W film is etched under this first etching condition so that end portions of the first conductive layer 5007 are made to have taper shapes.

Subsequently, the etching condition is changed to the second etching condition without removing the mask 5009 made of a resist. $CF_4$ and $Cl_2$ are used as etching gases and a ratio of respective gas flow rates is set to 30:30 (sccm). RF power having 500 W and 13.56 MHz is supplied to a coil type electrode at a pressure of 1.0 Pa to produce plasma, thereby conducting etching for about 15 seconds. RF power having 20 W and 13.56 MHz is supplied to a substrate side (sample stage) to apply a substantially negative self bias voltage thereto. In the second etching condition, both the first conductive film 5007 and the second conductive film 5008 are etched to the same degree. Note that, in order to conduct etching without leaving the residue on the gate insulating film 5006, it is preferable that an etching time is increased at a rate of about 10 to 20%.

In the above first etching processing, when a shape of the mask made of a resist is made suitable, the end portions of the first conductive film 5007 and the end portions of the second conductive film 5008 become taper shapes by an effect of the bias voltage applied to the substrate side. Thus, first-shaped conductive layers 5010 to 5014 made from the first conductive layer 5007 and the second conductive layer 5008 are formed by the first etching processing. With respect to the insulating film 5006, regions which are not covered with the first-shaped conductive layers 5010 to 5014 are etched by about 20 nm to 50 nm so that thinner regions are formed.

Figure 13C:
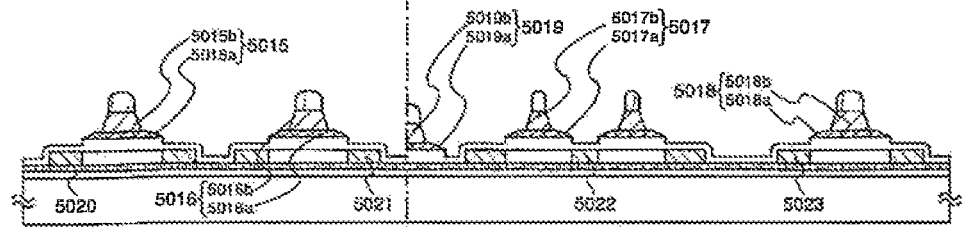
Figure 13D:
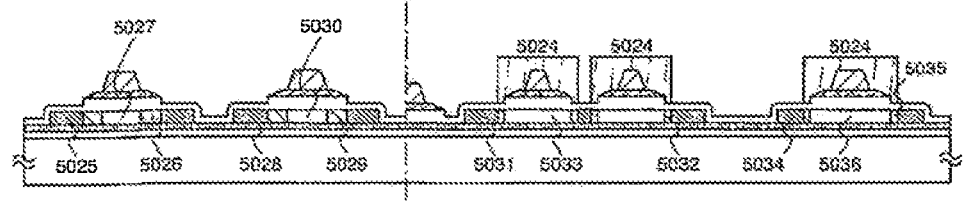

Next, second etching processing is performed without removing the mask 5009 made of a resist (FIG. 13C). In the second etching processing. $SF_6$, C, and $O_2$ are used as etching gases and a ratio of respective gas flow rates is set to 24:12:24 (sccm). RFP power having 700 W and 13.56 MHz is supplied to a coil type electrode at a pressure of 1.3 Pa to produce plasma, thereby conducting etching for about 25 seconds. RF power having 10 W and 13.56 MHz is supplied to a substrate side (sample stage) to apply a substantially negative self bias voltage thereto. Thus, the W film is selectively etched to form second-shaped conductive layers 5015 to 5019. At this time, first conductive layers 5015a to 5018a are hardly etched.

Then, first doping processing is performed without removing the mask 5009 made of a resist to add an impurity element for providing an N-type to the semiconductor layers 5002 to 5005 at a low concentration. The first doping processing is preferably performed by an ion doping method or an ion implantation method. With respect to a condition of the ion doping method, a dose is set to $1\times10^3$ atoms/cm$^2$ to $5\times10^{14}$ atoms/cm$^2$ and an accelerating voltage is set to 40 keV to 80 keV. In this example, a dose is set to $5.0\times10^{13}$ atoms/cm$^2$ and an accelerating voltage is set to 50 keV. As the impurity element for providing an N-type, an element which belongs to Group 15 is preferably used, and typically, phosphorus (P) or arsenic (As) is used. In this example, phosphorus (P) is used. In this case, the second-shaped conductive layers 5015 to 5019 become masks to the impurity element for providing an N-type. Thus, first impurity regions (N-regions) 5020 to 5023 are formed in a self alignment. Then, the impurity element for providing an N-type is added to the first impurity regions 5020 to 5023 at a concentration range of $1\times10^{18}$ atoms/cm$^2$ to $1\times10^{20}$ atoms/cm$^3$.

Subsequently, after the mask 5009 made of a resist is removed, a new mask 5024 made of a resist is formed and second doping processing is performed at a higher accelerating voltage than that in the first doping processing. In a condition of an ion doping method, a dose is set to $1\times10^{13}$ atoms/cm$^2$ to $3\times10^{15}$ atoms/cm$^2$ and an accelerating voltage is set to 60 keV to 120 keV. In this example, a dose is set to $3.0\times10^{15}$ atoms/cm$^2$ and an accelerating voltage is set to 65 keV. In the second doping processing, second conductive layers 5015b to 5018b are used as masks to an impurity element and doping is conducted such that the impurity element is added to the semiconductor layers located under the taper portions of the first conductive layers 5015a to 5018a.

As a result of the above second doping processing, the impurity element for providing an N-type is added to second impurity regions (N− regions; Lov regions) 5026, 5029 overlapped with the first conductive layers at a concentration range of $1\times10^{18}$ atoms/cm$^3$ to $5\times10^{19}$ atoms/cm. In addition, the impurity element for providing an N-type is added to third impurity regions (N+ regions) 5025, 5028, 5031 and 5034 at a concentration range of $1\times10^{19}$ atoms/cm$^3$ to $5\times10^{21}$ atoms/cm$^3$. After the first and second doping processings, regions to which no impurity element is added or regions to which the trace impurity element is added are formed in the semiconductor layers 5002 to 5005. In this example, the regions to which the impurity element is not completely added or the regions to which the trace impurity element is added are called channel regions 5027, 5030, 5033 and 5036. In addition, there are, of the first impurity regions (N-regions) 5020 to 5023 formed by the above first doping processing, regions covered with the resist 5024 in the second doping processing. In this example, they are continuously called first impurity regions (N− regions; LDD regions) 5032, 5035.

Note that, in this example, the second impurity regions (N− regions) 5026 and the third impurity regions (N+ regions) 5025, 5028, 5031 and 5034 are formed by only the second doping processing. However, the present invention is not limited to this. A condition for doping processing may be changed as appropriate and doping processing may be performed plural times to form those regions.

Figure 14A:
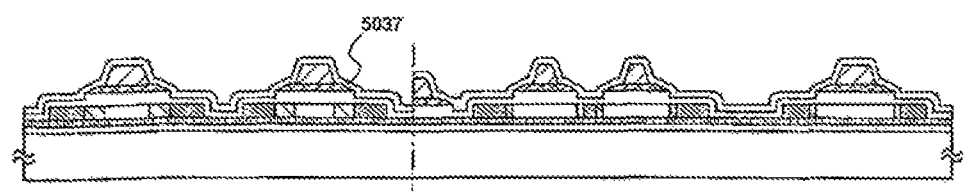
FIGS. 14A to 14C are diagrams for illustrating the fabrication processes of the semiconductor device.

Next, as shown in FIG. 14A, the mask 5024 made of a resist is removed and a first interlayer insulating film 5037 is formed. An insulating film containing silicon is formed as the first interlayer insulating film 5037 at a thickness of 100 nm to 200 nm by a plasma CVD method or a sputtering method. In this example, a silicon oxynitride film is formed at a film thickness of 100 nm by a plasma CVD method. Of course, the first interlayer insulating film 5037 is not limited to the silicon oxynitride film, and therefore another insulating film containing silicon may be used as a single layer or a laminate structure.

Next, heat treatment is performed for the recovery of crystallinity of the semiconductor layers and the activation of the impurity element added to the semiconductor layers. This heat treatment is performed by a thermal anneal method using a furnace anneal furnace. The thermal anneal method is preferably conducted in a nitrogen atmosphere in which an oxygen concentration is 1 ppm or less, preferably, 0.1 ppm or less at 400° C. to 700° C. In this example, the heat treatment at 410° C. for 1 hour is performed for the activation processing. Note that a laser anneal method or a rapid thermal anneal method (RTA method) can be applied in addition to the thermal anneal method.

Also, the heat treatment may be performed before the formation of the first interlayer insulating film 5037. However, if materials which compose the first conductive layers 5015a to 5019a and the second conductive layers 5015b to 5019b are sensitive to heat, it is preferable that heat treatment is performed after the first interlayer insulating film 5037 (insulating film containing mainly silicon, for example, silicon nitride film) for protecting a wiring and the like is formed as in this example.

As described above, when the heat treatment is performed after the formation of the first interlayer insulating film 5037 (insulating film containing mainly silicon, for example, silicon nitride film), the hydrogenation of the semiconductor layer can be also conducted simultaneously with the activation processing. In the hydrogenation step, a dangling bond of the semiconductor layer is terminated by hydrogen contained in the first interlayer insulating film 5037.

Note that heat treatment for hydrogenation which is different from the heat treatment for activation processing may be performed.

Here, the semiconductor layer can be hydrogenated regardless of the presence or absence of the first interlayer insulating film 5037. As another means for hydrogenation, means for using hydrogen excited by plasma (plasma hydrogenation) or means for performing heat treatment in an atmosphere containing hydrogen of 3% to 100% at 300° C. to 450° C. for 1 hour to 12 hours may be used.

Next, a second interlayer insulating film 5038 is formed on the first interlayer insulating film 5037. An inorganic insulating film can be used as the second interlayer insulating film 5038. For example, a silicon oxide film formed by a CVD method, a silicon oxide film applied by an SOG (spin on glass) method, or the like can be used. In addition, an organic insulating film can be used as the second interlayer insulating film 5038. For example, a film made of polyimide, polyamide, BCB (benzocyclobutene), acrylic, or the like can be used. Further, a laminate structure of an acrylic film and a silicon oxide film may be used.

In this example, an acrylic film having a film thickness of 1.61 m is formed. When the second interlayer insulating film 5038 is formed, unevenness caused by TFTs formed on the substrate 5000 is reduced and the surface can be leveled. In particular the second interlayer insulating film 5038 has a strong sense of leveling. Thus, a film having superior evenness is preferable.

Next, using dry etching or wet etching, the second interlayer insulating film 5038, the first interlayer insulating film 5037, and the gate insulating film 5006 are etched to form contact holes which reach the impurity regions 5025, 5028, 5031 and 5034.

Next, a pixel electrode 5039 made from a transparent conductive film is formed. A compound of indium oxide and tin oxide (indium tin oxide: ITO), a compound of indium oxide and zinc oxide, zinc oxide, tin oxide, indium oxide, or the like can be used for the transparent conductive film. In addition, the transparent conductive film to which gallium is added may be used. The pixel electrode corresponds to the anode of an EL element.

In this example, an ITO film is formed at a thickness of 110 nm and then patterned to form the pixel electrode 5039.

Next, wirings 5040 to 5046 electrically connected with the respective impurity regions are formed. Note that, in this example, a Ti film having a film thickness of 100 nm, an Al film having a film thickness of 350 nm, and a Ti film having a film thickness of 100 nm are formed into a laminate in succession by a sputtering method and a resultant laminate film is patterned in a predetermined shape so that the wirings 5040 to 5046 are formed.

Of course, they are not limited to a three-layer structure. A single layer structure, a two-layer structure, or a laminate structure composed of four layers or more may be used. Materials of the wirings are not limited to Al and Ti, and therefore other conductive films may be used. For example, an Al film or a Cu film is formed an a TaN film, a TI film is formed thereon, and then a resultant laminate film is patterned to form the wirings.

Here, a portion on the pixel electrode 5039 and a portion of the wiring 5045 are overlapped with each other so that electrical connection between the wiring 5045 and the pixel electrode 5039 is produced.

Figure 14B:
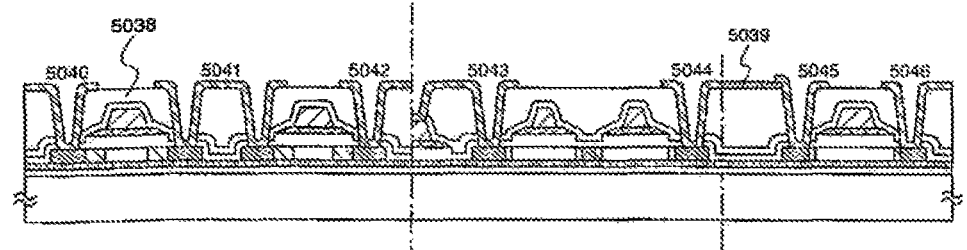

By the above steps, as shown in FIG. 14B, the driver circuit portion including the N-channel TFT and the pixel portion including the switching TFT and the driving TFT can be formed on the same substrate.

The N-channel TFT in the driver circuit portion includes low concentration impurity regions 5026 (Loff regions) overlapped with the first conductive layer 5015a composing a portion of the gate electrode and high concentration impurity regions 5025 which each serve as the source region or the drain region.

The N-channel switching TFT in the pixel portion includes low concentration impurity regions 5032 (Loff regions) formed outside the gate electrode and high concentration impurity regions 5031 which each serve as the source region or the drain region.

Next, a third interlayer insulating film 5047 is formed. An inorganic insulating film or an organic insulating film can be used as the third interlayer insulating film 5047. A silicon oxide film formed by a CVD method, a silicon oxide film applied by an SOG (spin on glass) method, or a silicon oxynitride formed by a sputtering method or the like can be used as the inorganic insulating film. In addition, an acrylic resin film or the like can be used as the organic insulating film.

Examples of a combination of the second interlayer insulating film 5038 and the third interlayer insulating film 5047 will be described below.

There is a combination in which a silicon oxynitride film formed by an acrylic and a sputtering method is used as the second interlayer insulating film 5038 and a silicon oxynitride film formed by a sputtering method is used as the third interlayer insulating film 5047. In addition, there is a combination in which a silicon oxide film formed by an SOG method is used as the second interlayer insulating film 5038 and a silicon oxide film formed by an SOG method is used as the third interlayer insulating film 5047. In addition, there is a combination in which a laminate film of a silicon oxide film formed by an SOG method and a silicon oxide film formed by a plasma CVD method is used as the second interlayer insulating film 5038 and a silicon oxide film formed by a plasma CVD method is used as the third interlayer insulating film 5047. In addition, there is a combination in which acrylic is used for the second interlayer insulating film 5038 and acrylic is used for the third interlayer insulating film 5047. In addition, there is a combination in which a laminate film of an acrylic film and a silicon oxide film formed by a plasma CVD method is used as the second interlayer insulating film 5038 and a silicon oxide film formed by a plasma CVD method is used as the third interlayer insulating film 5047. In addition, there is a combination in which a silicon oxide film formed by a plasma CVD method is used as the second interlayer insulating film 5038 and acrylic is used for the third interlayer insulating film 5047.

An opening portion is formed at a position corresponding to the pixel electrode 5039 in the third interlayer insulating film 5047. The third interlayer insulating film serves as a bank. When a wet etching method is used at the formation of the opening portion, it can be easily formed as a side wall having a taper shape. If the side wall of the opening portion is not sufficiently gentle, the deterioration of an EL layer by a step becomes a marked problem. Thus, attention is required.

A carbon particle or a metallic particle may be added into the third interlayer insulating film 5047 to reduce resistivity, thereby suppressing the generation of static electricity. At this time, the amount of carbon particle or metallic particle to be added is preferably adjusted such that the resistivity becomes $1\times10^6$ Ωm to $1\times10^2$ Ωm (preferably, $1\times10^8$ Ωm to $1\times10^{10}$ Ωm).

Next, an EL layer 5048 is formed on the pixel electrode 5039 exposed in the opening portion of the third interlayer insulating film 5047.

An organic light emitting material or an inorganic light emitting material which are known can be used as the EL layer 5048.

A low molecular weight based organic light emitting material, a high molecular weight based organic light emitting material, or a medium molecular weight based organic light emitting material can be freely used as the organic light emitting material. Note that in this specification, a medium molecular weight based organic light emitting material indicates an organic light emitting material which has no sublimation property and in which the number of molecules is 20 or less or a length of chained molecules is 10 ìm or less.

The EL layer 5048 has generally a laminate structure. Typically, there is a laminate structure of "a hole transporting layer, a light emitting layer, and an electron transporting layer", which has been proposed by Tang et al. in Eastman Kodak Company. In addition to this, a structure in which "a hole injection layer, a hole transporting layer, a light emitting layer, and an electron transporting layer" or "a hole injection layer, a hole transporting layer, a light emitting layer, an electron transporting layer, and an electron injection layer" are laminated on an anode in this order may be used. A light emitting layer may be doped with fluorescent pigment or the like.

In this example, the EL layer 5048 is formed by an evaporation method using a low molecular weight based organic light emitting material. Specifically, a laminate structure in which a copper phthalocyanine (CuPc) film having a thickness of 20 nm is provided as the hole injection layer and a tris-8-quinolinolato aluminum complex ($Alq_3$) film having a thickness of 70 nm is provided thereon as the light emitting layer is used. A light emission color can be controlled by adding fluorescent pigment such as quinacridon, perylene, or DCM1 to $Alq_3$.

Figure 14C:
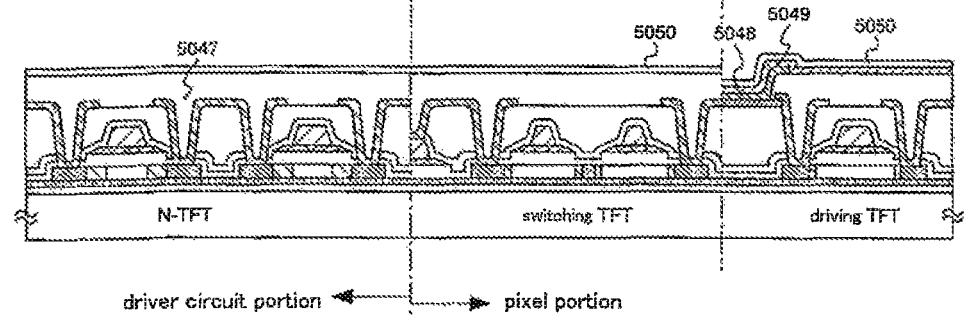

Note that only one pixel is shown in FIG. 14C. However, a structure in which the EL layers 5048 corresponding to respective colors of, plural colors, for example, R (red), G (green), and B (blue) are separately formed can be used.

Also, as an example using the high molecular weight based organic light emitting material, the EL layer 5048 may be constructed by a laminate structure in which a polythiophene (PEDO) film having a thickness of 20 nm is provided as the hole injection layer by a spin coating method and a paraphenylenevinylene (PPV) film having a thickness of about 100 nm is provided thereon as the light emitting layer. When π conjugated system polymer of PPV is used, a light emission wavelength from red to blue can be selected. In addition, an inorganic material such as silicon carbide can be used as the electron transporting layer and the electron injection layer.

Note that the EL layer 5048 is not limited to a layer having a laminate structure in which the hole injection layer, the hole transporting layer, the light emitting layer, the electron transporting layer, the electron injection layer, and the like are distinct. In other words, the EL layer 5048 may have a laminate structure with a layer in which materials composing the hole injection layer, the hole transporting layer, the light emitting layer, the electron transporting layer, the electron injection layer, and the like are mixed.

For example, the EL layer 5048 may have a structure in which a mixed layer composed of a material composing the electron transporting layer (hereinafter referred to as an electron transporting material) and a material composing the light emitting layer (hereinafter referred to as a light emitting material) is located between the electron transporting layer and the light emitting layer.

Next, a pixel electrode 5049 made from a conductive film is provided on the EL layer 5048. In the case of this example, an alloy film of aluminum and lithium is used as the conductive film. Of course, a known MgAg film (alloy film of magnesium and silver) may be used. The pixel electrode 5049 corresponds to the cathode of the EL element. A conductive film made of an element which belongs to Group 1 or Group 2 of the periodic table or a conductive film to which those elements are added can be freely used as a cathode material.

When the pixel electrode 5049 is formed, the EL element is completed. Note that the EL element indicates an element composed of the pixel electrode (anode) 5039, the EL layer 5048, and the pixel electrode (cathode) 5049.

It is effective that a passivation film 5050 is provided to completely cover the EL element. A single layer of an insulating film such as a carbon film, a silicon nitride film, or a silicon oxynitride film, or a laminate layer of a combination thereof can be used as the passivation film 5050.

It is preferable that a film having good coverage is used as the passivation film 5050, and it is effective to use a carbon film, particularly, a DLC (diamond like carbon) film and a CM film. The DLC film can be formed at a temperature range of from a room temperature to 100° C. Thus, a film can be easily formed over the EL layer 5047 having a low heat-resistance. In addition, the DLC film has a high blocking effect to oxygen so that the oxidization of the EL layer 5048 can be suppressed.

Note that, it is effective that steps up to the formation of the passivation film 5050 after the formation of the third interlayer insulating film 5047 are conducted in succession using a multi-chamber type (or in-line type) film formation apparatus without being exposed to air.

Note that, actually, when it is completed up to the state shown in FIG. 14C, in order not to be exposed to air, it is preferable that packaging (sealing) is conducted using a protective film (laminate film, ultraviolet curable resin film, or the like) or a transparent sealing member which has a high airtight property and low degassing. At this time, when an inner portion surrounded by the sealing member is made to an inert atmosphere or a hygroscopic material (for example, barium oxide) is located in the inner portion, the reliability of the EL element is improved.

Also, after an airtightness level is increased by processing such as packaging, a connector (flexible printed circuit: FPC) for connecting terminals led from elements or circuits which are formed on the substrate 5000 with external signal terminals is attached so that it is completed as a product.

Also, according to the steps described in this example, the number of photo masks required for manufacturing a semiconductor device can be reduced. As a result, the process is shortened and it can contribute to the reduction in manufacturing cost and the improvement of a yield.

Example 5

In this example, an example in which a semiconductor device is manufactured according to the present invention will be described using FIGS. 15A to 15C.

Figure 15A:
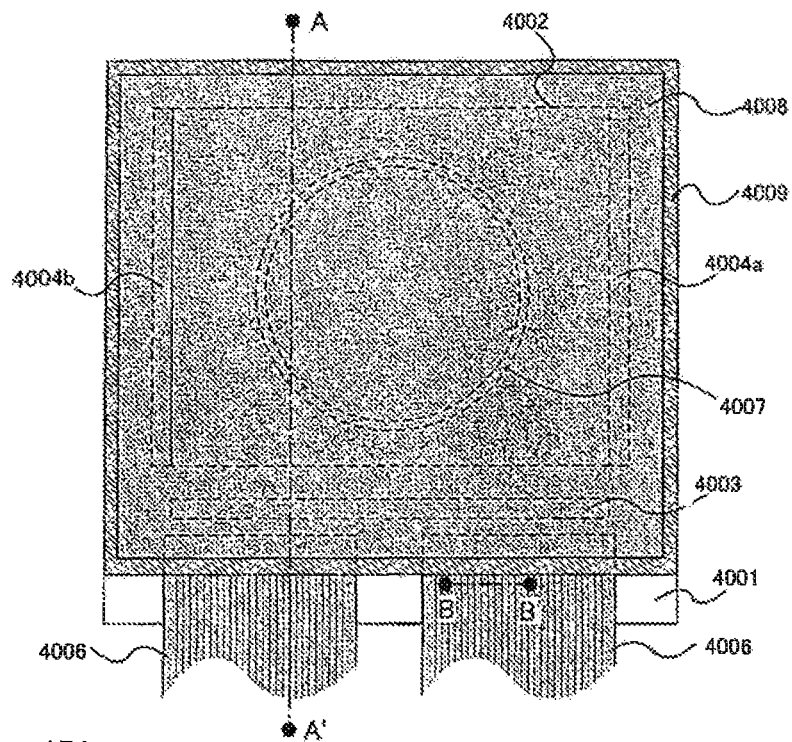
FIGS. 15A to 15C are a top view and cross sections of the semiconductor device.
Figure 15B:
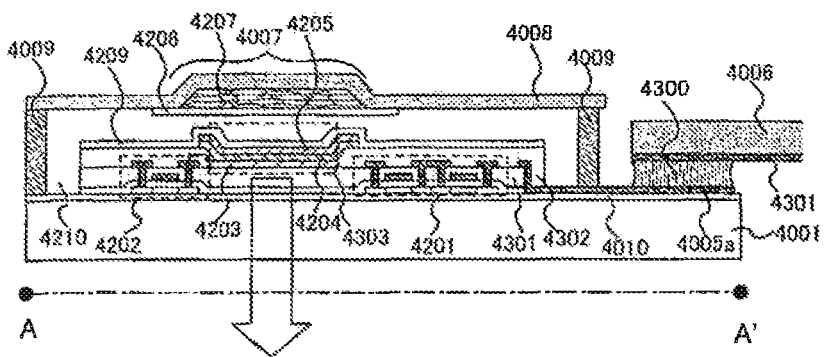

FIG. 15A is a top view of a semiconductor device produced by sealing an element substrate in which TFTs are formed with a sealing member FIG. 15B is a cross sectional view along a line A-A' in FIG. 15A. FIG. 15C is a cross sectional view along a line B-B' in FIG. 15A.

A seal member 4009 is provided to surround a pixel portion 4002, a source signal line driver circuit 4003, and first and second gate signal line driver circuits 4004a and 4004b which are provided on a substrate 4001. In addition, a sealing member 4008 is provided over the pixel portion 4002, the source signal line driver circuit 4003, and the first and second gate signal line driver circuits 4004a and 4004b. Thus, the pixel portion 4002, the source signal line driver circuit 4003, and the first and second gate signal line driver circuits 4004a and 4004b are sealed with the substrate 4001, the seal member 4009 and the sealing member 4008 and filled with a filling agent 4210.

Also, the pixel portion 4002, the source signal line driver circuit 4003, and the first and second gate signal line driver circuits 4004a and 4004b which are provided on the substrate 4001 each have a plurality of TFTs. In FIG. 15B, TFTs (note that an N-channel TFT and a P-channel TFT are shown here) 4201 included in the source signal line driver circuit 4003 and a TFT 4202 included in the pixel portion 4002, which are formed on a base film 4010 are typically shown.

An interlayer insulating film (planarization film) 4301 is formed on the TFTs 4201 and 4202, and a pixel electrode (anode) 4203 electrically connected with the drain of the TFT 4202 is formed thereon. A transparent conductive film having a large work function is used as the pixel electrode 4203. A compound of indium oxide and tin oxide, a compound of indium oxide and zinc oxide, zinc oxide, tin oxide, or indium oxide can be used for the transparent conductive film. In addition, the transparent conductive film to which gallium is added may be used.

An insulating film 4302 is formed on the pixel electrode 4203. An opening portion is formed in the insulating film 4302 on the pixel electrode 4203. In the opening portion, an organic light emitting layer 4204 is formed on the pixel electrode 4203. An organic light emitting material or an inorganic light emitting material which are known can be used as the organic light emitting layer 4204. In addition, the organic light emitting material includes a low molecular weight based (monomer system) material and a high molecular weight based (polymer system) material, and any material may be used.

An evaporation technique or an applying method technique which are known is preferably used as a method of forming the organic light emitting layer 4204. In addition, a laminate structure or a single layer structure which is obtained by freely combining a hole injection layer, a hole transporting layer, a light emitting layer, an electron transporting layer, and an electron injection layer is preferably used as the structure of the organic light emitting layer.

A cathode 4205 made from a conductive film having a light shielding property (typically, a conductive film containing mainly aluminum, copper, or silver, or a laminate film of the conductive film and another conductive film) is formed on the organic light emitting layer 4204. In addition, it is desirable that moisture and oxygen which exist in an interface between the cathode 4205 and the organic light emitting layer 4204 are minimized. Thus, a devise is required in which the organic light emitting layer 4204 is formed in a nitrogen atmosphere or a noble atmosphere and the cathode 4205 without being exposed to oxygen and moisture is formed. In this example, the above film formation is possible by using a multi-chamber type (cluster tool type) film formation apparatus. A predetermined voltage is supplied to the cathode 4205.

By the above steps, a light emitting element 4303 composed of the pixel electrode (anode) 4203, the organic light emitting layer 4204, and the cathode 4205 is formed. A protective film 4209 is formed on the insulating film 4302 so as to cover the light emitting element 4303. The protective film 4209 is effective to prevent oxygen, moisture, and the like from penetrating the light emitting element 4303.

Reference numeral 4005a denotes a lead wiring connected with a power source, which is connected with a first electrode of the TFT 4202. The lead wiring 4005a is passed between the seal member 4009 and the substrate 4001 and electrically connected with an FPC wiring 4301 of an FPC 4006 through an anisotropic conductive film 4300.

A glass material, a metallic member (typically, a stainless member), a ceramic member, a plastic member (including a plastic film) can be used as the sealing member 4008. An FRP (fiberglass reinforced plastic) plate, a PVF (polyvinyl fluoride) film, a Mylar film, a polyester film, or an acrylic resin film can be used as the plastic member. In addition, a sheet having a structure in which aluminum foil is sandwiched by a PVF film and a Mylar film can be used.

Note that, when a radiation direction of light from the light emitting element is toward a cover member side, it is required that the cover member is transparent. In this case, a transparent material such as a glass plate, a plastic plate, a polyester film, or acrylic film is used.

Also, in addition to an inert gas such as nitrogen or argon, ultraviolet curable resin or thermal curable resin can be used for the filling agent 4210. PVC (polyvinyl chloride), acrylic, polyimide, epoxy resin, silicon resin, PVB (polyvinyl butyral), or EVA (ethylene vinyl acetate) can be used. In this example, nitrogen is used for the filling agent.

Also, in order to expose the filling agent 4210 to a hygroscopic material (preferably barium oxide) or a material capable of absorbing oxygen, a concave portion 4007 is provided to the surface of the sealing member 4008 in the substrate 4001 side, and the hygroscopic material or the material capable of absorbing oxygen which is indicated by 4207 is located. In order to prevent the material 4207 having a hygroscopic property or being capable of absorbing oxygen from flying off, the material 4207 having a hygroscopic property or being capable of absorbing oxygen is held in the concave portion 4007 by a concave cover member 4208. Note that concave cover member 4208 is formed in a fine meshed shape and constructed such that it transmits air and moisture but does not transmit the material 4207 having a hygroscopic property or being capable of absorbing oxygen. When the material 4207 having a hygroscopic property or being capable of absorbing oxygen is provided, the deterioration of the light emitting element 4303 can be suppressed.

Figure 15C:
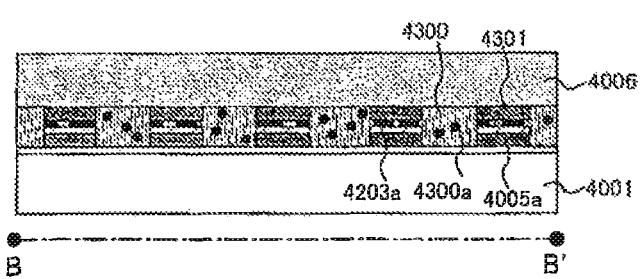

As shown in FIG. 15C, a conductive film 4203a is formed on the lead wiring 4005a such that it is in contact with the lead wiring 4005a simultaneously with the formation of the pixel electrode 4203.

Also, the anisotropic conductive film 4300 has a conductive filler 4300a. When the substrate 4001 and the FPC 4006 are bonded to each other by thermal compression, the conductive film 4203a located over the substrate 4001 and the FPC wiring 4301 located on the FPC 4006 are electrically connected with each other through the conductive filler 4300.

Example 6

In this example, an external light emitting quantum efficiency can be remarkably improved by using an organic light emitting material by which phosphorescence from a triplet excitation can be employed for emitting a light. As a result, the power consumption of light emitting element can be reduced, the lifetime of light emitting element can be elongated and the weight of light emitting element can be lightened.

The following is a report where the external light emitting quantum efficiency is improved by using the triplet excitation (r. Tsutsui, C. Adachi, S. Saito, Photochemical processes in Organized Molecular Systems, ed. K. Honda, (Elsevier Sci. Pub., Tokyo, 1991) p. 437).

The molecular formula of an organic light emitting material (coumarin pigment) reported by the above article is represented as follows.

Chemical formula 1

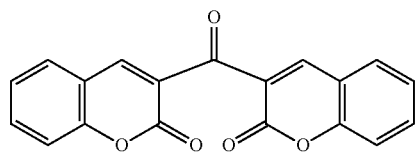

(M. A. Baldo, D. F. O'Brien, Y. You, A. Shoustlkov, S. Sibley, M. E. Thompson, S. R. Forrest, Nature 395 (1998) p. 151)

The molecular formula of an organic light emitting material (Pt complex) reported by the above article is represented as follows.

Chemical formula 2

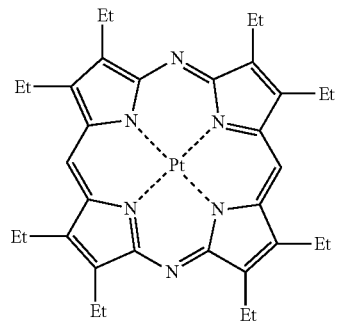

(M. A. Baldo, S. Lamapsky, P. E. Bunrows, M. E. Thompson, S. R. Forrest, Appl. Phys. Lett., 75 (1999) p. 4.)

(T. Tsutsui, M.-J. Yang, M. Yahiro, K. Nakamura, T. Watanabe T. Tsuji, Y. Fukuda, T. Wakimoto, S. Mayaguchi, Jpn, Appl. Phys, 38 (12B) (1999) L1502)

The molecular formula of an organic light emitting material (Ir complex) reported by the above article is represented as follows.

Chemical formula 3

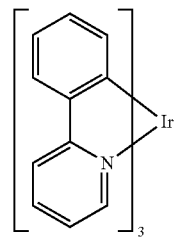

As described above, if phosphorescence from a triplet excitation can be put to practical use, it can realize the external light emitting quantum efficiency three to four times as high as that in the case of using fluorescence from a singlet excitation in principle.

Example 7

The light emitting device using the light emitting element is of the self-emission type, and thus exhibits more excellent recognizability of the displayed image in a light place as compared to the liquid crystal display device. Furthermore, the light emitting device has a wider viewing angle. Accordingly, the light emitting device can be applied to a display portion in various electronic apparatuses.

Such electronic apparatuses using a light emitting device of the present invention include a video camera, a digital camera, a goggles-type display (head mount display), a navigation system, a sound reproduction device (a car audio equipment and an audio set), a lap-top computer, a game machine, a portable information terminal (a mobile computer, a mobile phone, a portable game machine, an electronic book, or the like), an image reproduction device including a recording medium (more specifically, an device which can reproduce a recording medium such as a digital versatile disc (DVD) and so forth, and includes a display for displaying the reproduced image), or the like. In particular, in the case of the portable information terminal, use of the light emitting device is preferable, since the portable information terminal that is likely to be viewed from a tilted direction is often required to have a wide viewing angle. FIG. 20 respectively shows various specific examples of such electronic apparatuses.

Figure 20A:
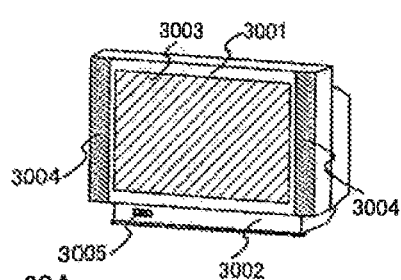
FIGS. 20A to 20H are diagrams depicting examples of electronic devices applicable to the invention.

FIG. 20A illustrates a light emitting display device which includes a casing 3001, a support table 3002, a display portion 3003, a speaker portion 3004, a video input terminal 3005 or the like. The present invention is applicable to the display portion 3003. The light emitting device is of the self-emission-type and therefore requires no backlight. Thus, the display portion thereof can have a thickness thinner than that of the liquid crystal display device. The light emitting display device is including the entire display device for displaying information, such as a personal computer, a receiver of TV broadcasting and an advertising display.

Figure 20B:
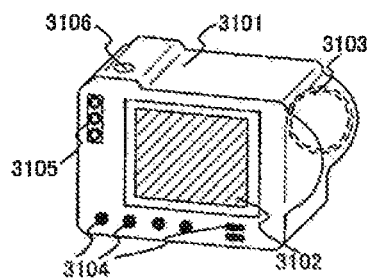

FIG. 20B illustrated a digital still camera which includes a main body 3101, a display portion 3102, an image receiving portion 3103, an operation key 3104, an external connection port 3105, a shutter 3106, or the like. The light emitting device in accordance with the present invention can be used as the display portion 3102.

Figure 20C:
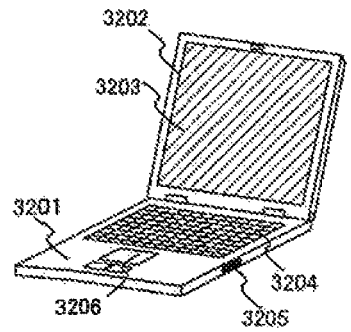

FIG. 20C illustrates a lap-top computer which includes a main body 3201, a casing 3202, a display portion 3203, a keyboard 3204, an external connection port 3205, a pointing mouse 3206, or the like. The light emitting device in accordance with the present invention can be used as the display portion 3203.

Figure 20D:
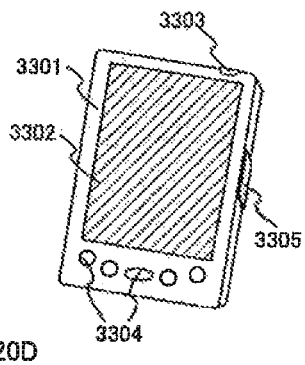

FIG. 20D illustrated a mobile computer which includes a main body 3301, a display portion 3302, a switch 3303, an operation key 3304, an infrared port 3305, or the like. The light emitting device in accordance with the present invention can be used as the display portion 3302.

Figure 20E:
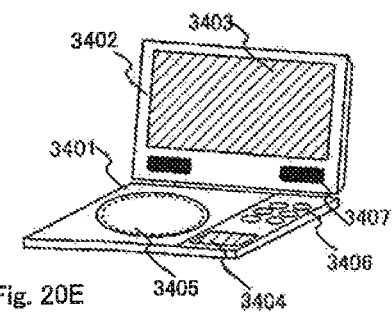

FIG. 20E illustrates a portable image reproduction device including a recording medium (more specifically, a DVD reproduction device), which includes a main body 3401, a casing 3402, a display portion A 3403, another display portion B 3404, a recording medium (DVD or the like) reading portion 3405, an operation key 3406, a speaker portion 3407 or the like. The display portion A 3403 is used mainly for displaying image information, while the display portion B 3404 is used mainly for displaying character information. The light emitting device in accordance with the present invention can be used as these display portions A 3403 and B 3404. The image reproduction device including a recording medium further includes a game machine or the like.

Figure 20F:
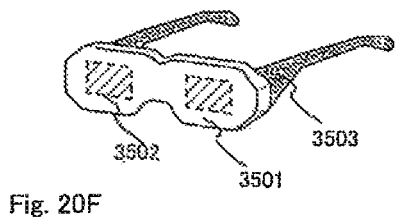

FIG. 20F illustrates a goggle type display (head mounted display) which is includes a main body 3501, a display portion 3502, arm portion 3503 or the like. The light emitting device in accordance with the present invention can be used as the display portion 3502.

Figure 20G:
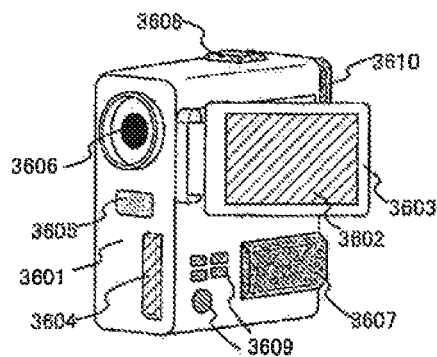

FIG. 20G illustrates a video camera which includes a main body 3601, a display portion 3602, a casing 3603, an external connecting port 3604, a remote control receiving portion 3605, an image receiving portion 3606, a battery 3607, a sound input portion 3608, an operation key 3609, an eyepiece 3610, or the like. The light emitting device in accordance with the present invention can be used as the display portion 3602.

Figure 20H:
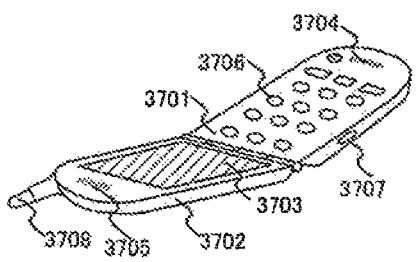

FIG. 20H illustrates a mobile phone which includes a main body 3701, a casing 3702, a display portion 3703, a sound input portion 3704, a sound output portion 3705, an operation key 3706, an external connecting port 3707, an antenna 3708, or the like. The light emitting device in accordance with the present invention can be used as the display portion 3703. Note that the display portion 3703 can reduce power consumption of the mobile telephone by displaying white-colored characters on a black-colored background.

When a brighter luminance of light emitted from the organic light emitting material becomes available in the future, the light emitting device in accordance with the present invention will be applicable to a front-type or rear-type projector in which light including output image information is enlarged by means of lenses or the like to be projected.

The aforementioned electronic apparatuses are more likely to be used for display information distributed through a telecommunication path such as Internet, a CATV (cable television system), and in particular likely to display moving picture information. The light emitting device is suitable for displaying moving pictures since the organic light emitting material can exhibit high response speed.

A portion of the light emitting device that is emitting light consumes power, so it is desirable to display information in such a manner that the light emitting portion therein becomes as small as possible. Accordingly, when the light emitting device is applied to a display portion which mainly displays character information, e.g., a display portion of a portable information terminal, and more particular, a portable telephone or a sound reproduction device, it is desirable to drive the light emitting device so that the character information is formed by a light emitting portion while a non-emission portion corresponds to the background.

As set forth above, the present invention can be applied variously to a wide range of electronic apparatuses in all fields. The electronic apparatuses in this example can be obtained by utilizing a light emitting device having the structure in which the structures in Example 1 through 6 are freely combined.

Example 8

In this example, the top view of the pixel configuration shown in FIG. 21A will be described with FIG. 22.

Figure 22:
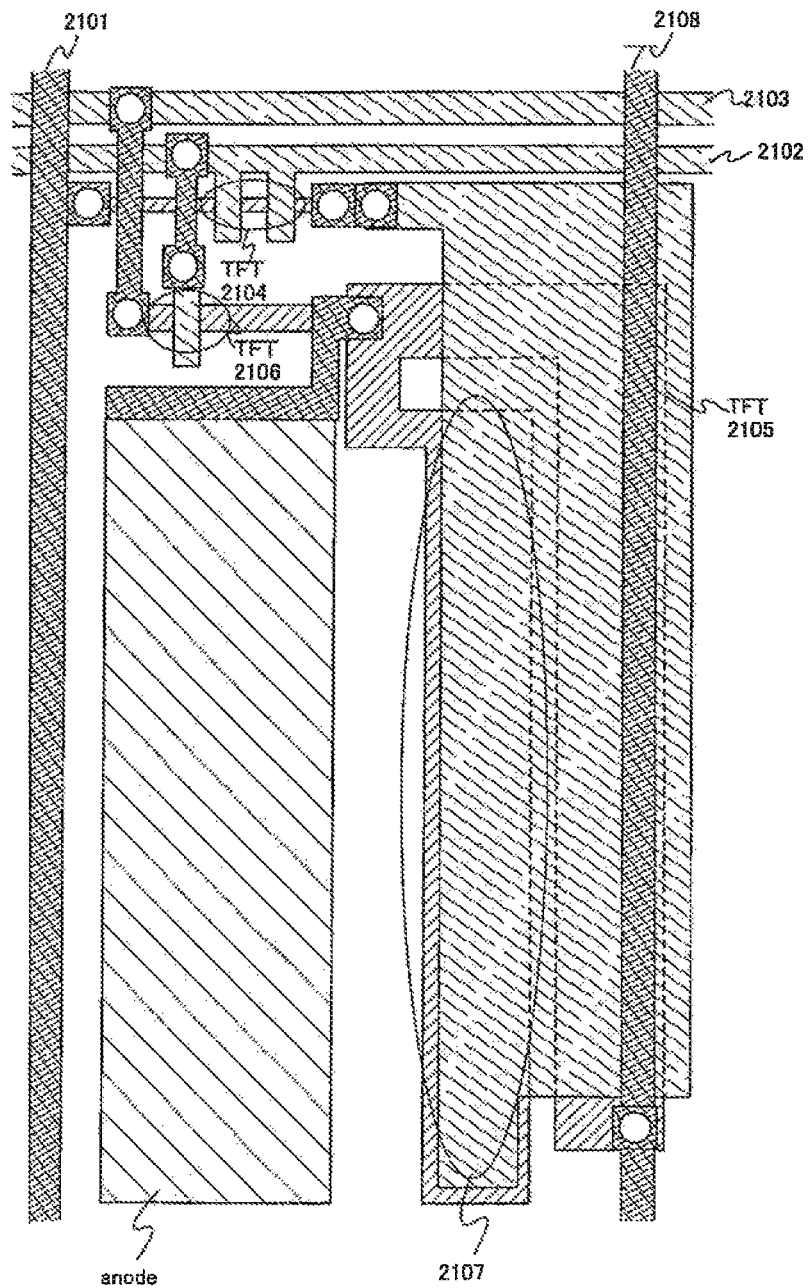
FIG. 22 is a diagram depicting a top view of the pixel configuration of the invention.

In FIG. 22, a plurality of active layers is formed by patterning the same layer in the region to form TFTs. Then, the first gate line 2102, the second gate line 2103, and the gate electrodes for the separate TFTs are formed by patterning the same layer. Subsequently, the source signal lines 2101 and the current supply line 2108 are formed by patterning the same layer. Lastly, the first electrode (it is the anode here) of the EL element (light emitting element) is formed.

Then, a selecting TFT 2104 that a part of the first gate line 2102 is the gate electrode is disposed. The TFT. 2104 is formed to have the double gate structure where two gate electrodes are formed in one active layer, whereby it allows surer selecting (switching) than the single gate structure where one gate electrode is formed in one active layer. In addition, the TFT 2104 can also be formed to have the multi-gate structure where three or more gate electrodes are formed in one active layer.

Furthermore, the channel length (L) of the TFT 2105 is set longer in order to reduce variations in the TFTs. Moreover, L is further longer, whereby the saturation region of the TFT is allowed to be flat.

Besides, the TFT 2106 having the gate electrode connected to the second gate line 2103 through contacts is formed. Additionally, the capacitance element 2107 formed of the active layer and the same layer as a scanning line is disposed.

For such the configuration of each of the TFTs, it is acceptable that the top gate structure where the gate electrode is laid over a semiconductor film (channel forming region) or the bottom gate structure reverse to this is used, and the offset structure or the GOLD structure is used for impurity regions (the source region or drain region).

According to the invention, in the semiconductor device configured of the unipolar TFTs, the N-channel TFTs particularly excellent in the electric characteristics as devices, such the configuration is formed that variations in the gate-source voltage of the driving TFT are not generated due to the deteriorated EL element, whereby hardly allowing the luminance to be reduced even when the EL element is deteriorated. In addition, the configuration proposed in the invention does not need either to be a complex configuration or to increase the number of elements forming the pixel. Therefore, it can be applied without causing demerits such as a decrease in the numerical aperture, thus being greatly useful.

Although the present invention has been described in conjunction with the preferred embodiments, the present invention should not be limited to these embodiments. For example, transistors used in the present invention may be any one of a thin film transistor (TFT) in which an active layer is made of crystalline semiconductor or amorphous semiconductor, a single crystal transistor, or a transistor using an organic semiconductor material as an active layer thereof. For example, a transistor formed by using the SOI technique may be used as a single crystal thin film transistor, and a thin film transistor comprising poly-silicon or amorphous silicon may be used as the thin film transistor.

What is claimed is:

1. A display device comprising:
    a pixel comprising:
        a first transistor, a second transistor, a third transistor, a fourth transistor, and a capacitor; and
        a light-emitting element,
    wherein one of a source and a drain of the first transistor is directly connected to a first wiring,
    wherein the other of the source and the drain of the first transistor is directly connected to one of a source and a drain of the fourth transistor,
    wherein a gate electrode of the second transistor is directly connected to a first electrode of the capacitor,
    wherein one of a source and a drain of the second transistor is directly connected to a second wiring,
    wherein the other of the source and the drain of the second transistor is electrically connected to the light-emitting element,
    wherein one of a source and a drain of the third transistor is directly connected to the light-emitting element,
    wherein the other of the source and the drain of the third transistor is directly connected to a third wiring,
    wherein a gate electrode of the first transistor is directly connected to a fourth wiring, and
    wherein a gate electrode of the fourth transistor is directly connected to a fifth wiring.

2. The display device according to claim 1,
    wherein the first wiring is a source signal line,
    wherein the second wiring is a current supply line,
    wherein the third wiring is a power supply line, and
    wherein each of the fourth wiring and the fifth wiring is a gate signal line.

3. The display device according to claim 1, wherein each of the first transistor, the second transistor, the third transistor, and the fourth transistor is an N-channel transistor.

4. The display device according to claim 1, wherein each of the first transistor, the second transistor, the third transistor, and the fourth transistor comprises a crystalline semiconductor film.

5. The display device according to claim 1, wherein each of the first transistor, the second transistor, the third transistor, and the fourth transistor comprises an amorphous semiconductor film, a micro-crystalline semiconductor film, or a compound semiconductor film.

6. The display device according to claim 1, wherein the display device is a light-emitting display device.

7. The display device according to claim 1, wherein a gate electrode of the third transistor is electrically connected to the fourth wiring.

8. The display device according to claim 1, wherein the other of the source and the drain of the fourth transistor is electrically connected to the third wiring.

9. The display device according to claim 1, wherein the other of the source and the drain of the third transistor is electrically connected to the other of the source and the drain of the fourth transistor.

10. The display device according to claim 1,
    wherein the other of the source and the drain of the first transistor is electrically connected to the gate electrode of the second transistor, and
    wherein the other of the source and the drain of the second transistor is electrically connected to a second electrode of the capacitor.

11. An electronic apparatus comprising the display device according to claim 1.

* * * * *